(12) United States Patent
Kushibe et al.

(10) Patent No.: US 8,569,738 B2
(45) Date of Patent: Oct. 29, 2013

(54) SEMICONDUCTOR LIGHT EMITTING DEVICE, WAFER, METHOD FOR MANUFACTURING SEMICONDUCTOR LIGHT EMITTING DEVICE, AND METHOD FOR MANUFACTURING WAFER

(75) Inventors: Mitsuhiro Kushibe, Tokyo (JP); Yasuo Ohba, Kanagawa-ken (JP); Kei Kaneko, Kanagawa-ken (JP); Hiroshi Katsuno, Tokyo (JP); Shinji Yamada, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 190 days.

(21) Appl. No.: 12/876,685

(22) Filed: Sep. 7, 2010

(65) Prior Publication Data

US 2011/0227033 A1    Sep. 22, 2011

(30) Foreign Application Priority Data

Mar. 17, 2010  (JP) .................................. 2010-061683

(51) Int. Cl.
*H01L 33/04*    (2010.01)
(52) U.S. Cl.
USPC .................................. 257/14; 257/E33.028
(58) Field of Classification Search
USPC ............................................ 257/14, E33.028
See application file for complete search history.

(56) References Cited

U.S. PATENT DOCUMENTS

| | | | |
|---|---|---|---|
| 5,990,495 A | 11/1999 | Ohba et al. | |
| 7,514,707 B2 * | 4/2009 | Sakai | 257/13 |
| 2001/0035531 A1 | 11/2001 | Kano et al. | |
| 2006/0273324 A1 * | 12/2006 | Asai et al. | 257/79 |
| 2008/0237570 A1 * | 10/2008 | Choi et al. | 257/13 |
| 2009/0008648 A1 * | 1/2009 | Biwa et al. | 257/76 |
| 2009/0283793 A1 * | 11/2009 | Osawa et al. | 257/100 |
| 2010/0055819 A1 | 3/2010 | Ohba et al. | |

FOREIGN PATENT DOCUMENTS

| | | |
|---|---|---|
| JP | 9-64477 | 3/1997 |
| JP | 2713094 | 10/1997 |
| JP | 2001-274096 | 10/2001 |
| JP | 2003-59938 | 2/2003 |
| JP | 2004-335559 | 11/2004 |
| JP | 2009-38239 | 2/2009 |

(Continued)

OTHER PUBLICATIONS

Japanese Office Action issued May 7, 2012, in Japan Patent Application No. 2010-061683 (with English Translation).
Office Action issued May 23, 2012 in Korean Patent Application No. 10-2010-0087448 (with English translation).

(Continued)

*Primary Examiner* — Wensing Kuo
(74) *Attorney, Agent, or Firm* — Oblon, Spivak, McClelland, Maier & Neustadt, L.L.P.

(57) ABSTRACT

According to one embodiment, a semiconductor light emitting device includes a first layer, a second layer, and a light emitting portion. The first layer includes at least one of n-type GaN and n-type AlGaN. The second layer includes p-type AlGaN. The light emitting portion has a single quantum well structure. The single quantum well structure includes a first barrier layer, a second barrier layer, and a well layer. The first barrier layer is provided between the first layer and the second layer and includes $Al_{x1}Ga_{1-x1-y1}In_{y1}N$ ($0<x1$, $0\le y1$, $x1+y1<1$). The second barrier layer is provided between the first barrier layer and the second layer and includes $Al_{x2}Ga_{1-x2-y2}In_{y2}N$ ($0<x2$, $0\le y2$, $x2+y2<1$). The well layer is provided between the first barrier layer and the second barrier layer, includes $Al_{x0}Ga_{1-x0-y0}In_{y0}N$ ($0\le x0$, $0<y0$, $x0+y0<1$, $y1<y0$, $y2<y0$), and is configured to emit near ultraviolet light.

29 Claims, 9 Drawing Sheets

(56) References Cited

FOREIGN PATENT DOCUMENTS

| | | |
|---|---|---|
| JP | 2010-56210 | 3/2010 |
| KR | 2003-0083011 | 10/2003 |
| KR | 10-2004-0029165 | 4/2004 |
| TW | 1247437 | 1/2006 |
| TW | 1299915 | 8/2008 |
| TW | 200913415 | 3/2009 |
| TW | 200915618 | 4/2009 |
| WO | WO 99/46822 | 9/1999 |
| WO | WO 02/080320 A1 | 10/2002 |

OTHER PUBLICATIONS

Combined Chinese Office Action and Search Report Issued Dec. 27, 2012 in Patent Application No. 201010275570.3 (with English translation and English translation of Categories of Cited Documents).

Ansgar Laubsch, et al. "High-Power and High-Efficiency InGaN-based Light Emitters." IEEE Transactions of Electron Devices. vol. 57. No. 1. Jan. 2010. pp. 79-87.

Korean Office Action issued Oct. 20, 2011, in Patent Application No. 10-2010-0087448 (with English-language translation).

Office Action mailed Aug. 5, 2013 in Taiwanese Application No. 099130067 (w/English translation).

\* cited by examiner

SEMICONDUCTOR LIGHT EMITTING DEVICE, WAFER, METHOD FOR MANUFACTURING SEMICONDUCTOR LIGHT EMITTING DEVICE, AND METHOD FOR MANUFACTURING WAFER

CROSS-REFERENCE TO RELATED APPLICATIONS

This application is based upon and claims the benefit of priority from the prior Japanese Patent Application No. 2010-061683, filed on Mar. 17, 2010; the entire contents of which are incorporated herein by reference.

FIELD

Embodiments described herein relate generally to a semiconductor light emitting device, a wafer, a method for manufacturing the semiconductor light emitting device, and a method for manufacturing the wafer.

BACKGROUND

Nitride semiconductors are used in various semiconductor devices such as semiconductor light emitting devices and HEMT (high electron mobility transistor) devices. However, the characteristics of such nitride semiconductor devices are restricted by high-density threading dislocations due to lattice mismatch with the GaN crystal.

For example, one of the semiconductor light emitting devices based on nitride semiconductors is a near ultraviolet LED (light emitting diode) device (for example, the emission wavelength is, e.g., 400 nm or shorter). The near ultraviolet LED is expected to serve as a phosphor-exciting light source for white LED and the like. However, it has the problem of low efficiency.

Various proposals have been made to increase the efficiency of the near ultraviolet LED based on nitride semiconductors. For example, Japanese Patent No. 2713094 proposes a configuration for controlling the condition for various layers included in the semiconductor light emitting device. However, there is room for improvement in increasing the efficiency of the near ultraviolet LED.

DETAILED DESCRIPTION

Figure 1:
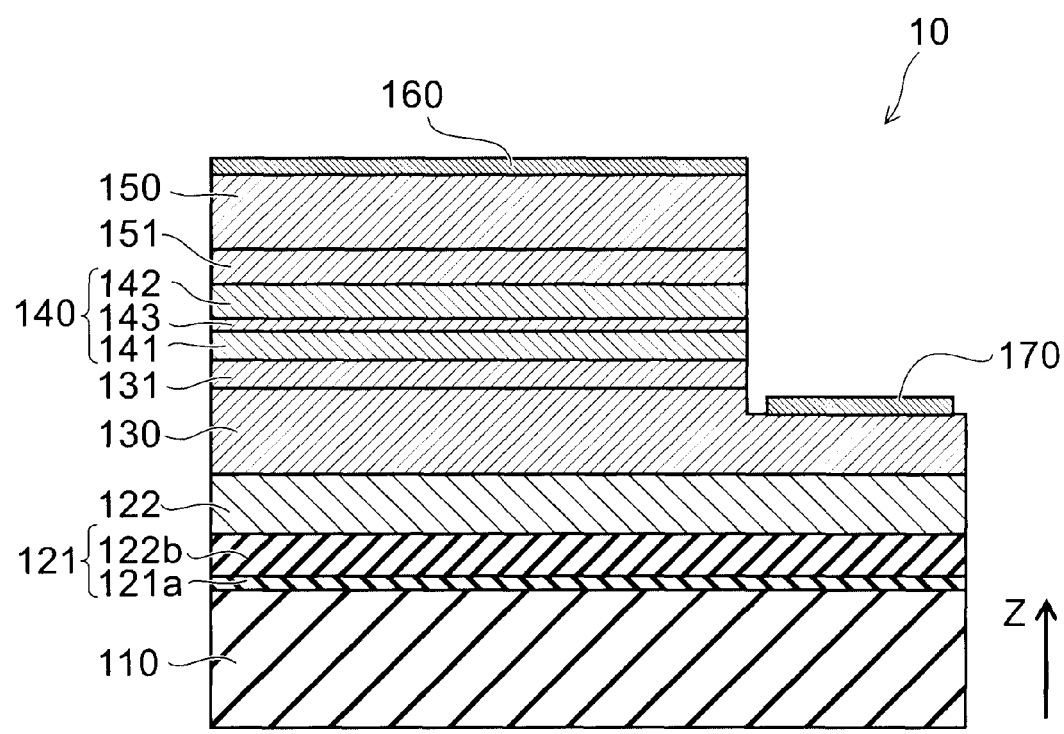
FIG. 1 is a schematic cross-sectional view illustrating the configuration of a semiconductor light emitting device according to a first embodiment.

In general, according to one embodiment, a semiconductor light emitting device includes a first layer, a second layer, and a light emitting portion. The first layer includes at least one of n-type GaN and n-type AlGaN. The second layer includes p-type AlGaN. The light emitting portion has a single quantum well structure. The single quantum well structure includes a first barrier layer, a second barrier layer, and a well layer. The first barrier layer is provided between the first layer and the second layer and includes $Al_{x1}Ga_{1-x1-y1}In_{y1}N$ ($0<x1$, $0\le y1$, $x1+y1<1$). The second barrier layer is provided between the first barrier layer and the second layer and includes $Al_{x2}Ga_{1-x2-y2}In_{y2}N$ ($0<x2$, $0\le y2$, $x2+y2<1$). The well layer is provided between the first barrier layer and the second barrier layer, includes $Al_{x0}Ga_{1-x0-y0}In_{y0}N$ ($0\le x0$, $0<y0$, $x0+y0<1$, $y1<y0$, $y2<y0$), and is configured to emit near ultraviolet light.

According to another embodiment, a wafer includes a first layer, a second layer, and a light emitting portion. The first layer includes at least one of n-type GaN and n-type AlGaN. The second layer includes p-type AlGaN. The light emitting portion has a single quantum well structure. The single quantum well structure includes a first barrier layer, a second barrier layer, and a well layer. The first barrier layer is provided between the first layer and the second layer and includes $Al_{x1}Ga_{1-x1-y1}In_{y1}N$ ($0<x1$, $0\le y1$, $x1+y1<1$). The second barrier layer is provided between the first barrier layer and the second layer and includes $Al_{x2}Ga_{1-x2-y2}In_{y2}N$ ($0<x2$, $0\le y2$, $x2+y2<1$). The well layer is provided between the first barrier layer and the second barrier layer, includes $Al_{x0}Ga_{1-x0-y0}In_{y0}N$ ($0\le x0$, $0<y0$, $x0+y0<1$, $y1<y0$, $y2<y0$), and is configured to emit near ultraviolet light.

According to yet another embodiment, a method is disclosed for manufacturing a semiconductor light emitting device. The method can form a single crystal buffer layer on a substrate whose major surface is a c-plane of a sapphire layer. The single crystal buffer layer includes $Al_{x3}Ga_{1-x3}N$ ($0.8\le x3\le 1$). The method can form a GaN layer on the single crystal buffer layer and form an n-type semiconductor layer on the GaN layer. The n-type semiconductor layer includes a first layer. The first layer includes at least one of n-type GaN and n-type AlGaN. The method can form a first barrier layer on the n-type semiconductor layer. The first barrier layer includes $Al_{x1}Ga_{1-x1-y1}In_{y1}N$ ($0<x1$, $0\le y1$, $x1+y1<1$). The method can form a well layer on the first barrier layer. The well layer includes $Al_{x0}Ga_{1-x0-y0}In_{y0}N$ ($0\le x0$, $0<y0$, $x0+y0<1$, $y1<y0$, $y2<y0$) and is configured to emit near ultraviolet light. The method can form a second barrier layer on the well layer. The second barrier layer includes $Al_{x2}Ga_{1-x2-y2}In_{y2}N$ ($0<x2$, $0\le y2$, $x2+y2<1$). The method can form a p-type semiconductor layer on the second barrier layer. The p-type semiconductor layer includes a second layer. The second layer includes p-type AlGaN. In addition, the method can remove the substrate after the forming of the p-type semiconductor layer.

According to yet another embodiment, a method is disclosed for manufacturing a semiconductor light emitting device. The method can form an AlN layer on a substrate made of sapphire by metal organic chemical vapor deposition, form a GaN layer on the AlN layer by metal organic chemical vapor deposition, and form an n-type semiconductor layer on the GaN layer by metal organic chemical vapor deposition. The n-type semiconductor layer includes a first layer. The first layer includes at least one of n-type GaN and n-type AlGaN. The method can form a first barrier layer on the n-type semiconductor layer by metal organic chemical vapor deposition. The first barrier layer includes $Al_{x1}Ga_{1-x1-y1}In_{y1}N$ ($0<x1$, $0\leq y1$, $x1+y1<1$). The method can form a well layer on the first barrier layer by metal organic chemical vapor deposition. The well layer includes $Al_{x0}Ga_{1-x0-y0}In_{y0}N$ ($0\leq x0$, $0<y0$, $x0+y0<1$, $y1<y0$, $y2<y0$) and is configured to emit near ultraviolet light. The method can form a second barrier layer on the well layer by metal organic chemical vapor deposition. The second barrier layer includes $Al_{x2}Ga_{1-x2-y2}In_{y2}N$ ($0<x2$, $0\leq y2$, $x2+y2<1$). In addition, the method can form a p-type semiconductor layer on the second barrier layer by metal organic chemical vapor deposition. The p-type semiconductor layer includes a second layer. The second layer includes p-type AlGaN.

According to yet another embodiment, a method is disclosed for manufacturing a wafer. The method can form an AlN layer on a substrate made of sapphire by metal organic chemical vapor deposition, form a GaN layer on the AlN layer by metal organic chemical vapor deposition, and form an n-type semiconductor layer on the GaN layer by metal organic chemical vapor deposition. The n-type semiconductor layer includes a first layer. The first layer includes at least one of n-type GaN and n-type AlGaN. The method can form a first barrier layer on the n-type semiconductor layer by metal organic chemical vapor deposition. The first barrier layer includes $Al_{x1}Ga_{1-x1-y1}In_{y1}N$ ($0<x1$, $0\leq y1$, $x1+y1<1$). The method can form a well layer on the first barrier layer by metal organic chemical vapor deposition. The well layer includes $Al_{x0}Ga_{1-x0-y0}In_{y0}N$ ($0\leq x0$, $0<y0$, $x0+y0<1$, $y1<y0$, $y2<y0$) and is configured to emit near ultraviolet light. The method can form a second barrier layer on the well layer by metal organic chemical vapor deposition. The second barrier layer includes $Al_{x2}Ga_{1-x2-y2}In_{y2}N$ ($0<x2$, $0\leq y2$, $x2+y2<1$). In addition, the method can form a p-type semiconductor layer on the second barrier layer by metal organic chemical vapor deposition. The p-type semiconductor layer includes a second layer. The second layer includes p-type AlGaN.

Embodiments of the invention will now be described in detail with reference to the drawings.

The drawings are schematic or conceptual. The relationship between the thickness and the width of each portion, and the size ratio between the portions, for example, are not necessarily identical to those in reality. Furthermore, the same portion may be shown with different dimensions or ratios depending on the figures.

In the specification of the application and the drawings, the same components as those described previously with reference to earlier figures are labeled with like reference numerals, and the detailed description thereof is omitted as appropriate.

FIG. 1 is a schematic cross-sectional view illustrating the configuration of a semiconductor light emitting device according to a first embodiment of the invention.

As shown in FIG. 1, the semiconductor light emitting device 10 according to this embodiment includes a first layer 131 including at least one of n-type GaN and n-type AlGaN, a second layer 151 including p-type AlGaN, and a light emitting portion 140 provided between the first layer 131 and the second layer 151.

The first layer 131, the light emitting portion 140, and the second layer 151 are stacked along a Z-axis direction. The first layer 131 includes, for example, Si. The second layer 151 includes, for example, Mg.

The light emitting portion 140 has a single quantum well (SQW) structure made of a first barrier layer 141, a second barrier layer 142, and a well layer 143. The first barrier layer 141 is provided between the first layer 131 and the second layer 151. The second barrier layer 142 is provided between the first barrier layer 141 and the second layer 151. The well layer 143 is provided between the first barrier layer 141 and the second barrier layer 142.

The first barrier layer 141, the well layer 143, and the second barrier layer 142 are stacked along the Z-axis direction.

The first barrier layer 141 includes $Al_{x1}Ga_{1-x1-y1}In_{y1}N$ ($0<x1$, $0\leq y1$, $x1+y1<1$).

The second barrier layer 142 includes $Al_{x2}Ga_{1-x2-y2}In_{y2}N$ ($0<x2$, $0\leq y2$, $x2+y2<1$). Here, x2 may be equal to or different from x1. Furthermore, y2 may be equal to or different from y1. In particular, $x2<x1$ is more preferable.

The well layer 143 includes $Al_{x0}Ga_{1-x0-y0}In_{y0}N$ ($0\leq x0$, $0<y0$, $x0+y0<1$, $y1<y0$, $y2<y0$). That is, the well layer 143 includes $Ga_{1-y0}In_{y0}N$ ($0<y0\leq 1$, $y1<y0$, $y2<y0$).

The well layer 143 has a thickness (length along the Z-axis direction) of not smaller than 4.5 nanometers (nm) and not larger than 9 nm.

The well layer 143 emits near ultraviolet light. The peak wavelength of the emission light of the well layer 143 is, for example, not shorter than 380 nm and not longer than 400 nm. That is, the peak wavelength of the emission light of the light emitting portion 140 is, for example, not shorter than 380 nm and not longer than 400 nm. That is, the semiconductor light emitting device 10 according to this embodiment emits near ultraviolet light.

By the configuration described above, the semiconductor light emitting device 10 according to this embodiment can emit near ultraviolet light with high efficiency.

In this example, the first layer 131 is illustratively a Si-including n-type confinement layer. The second layer 151 is illustratively a p-type confinement layer made of Mg-including p-type AlGaN.

For example, in the semiconductor light emitting device 10 as shown in FIG. 1, a first buffer layer 121 made of AlN is provided on a substrate 110 having a surface made of, for example, sapphire c-plane, and a second buffer layer 122 (lattice relaxation layer) made of non-doped GaN is provided thereon. Specifically, the first buffer layer 121 includes a high carbon concentration first AlN buffer layer 121a formed on the substrate 110 and a high purity second AlN buffer layer 121b formed on the first AlN buffer layer 121a. The carbon concentration in the first AlN buffer layer 121a is higher than the carbon concentration in the second AlN buffer layer 121b.

On the second buffer layer 122, an n-type contact layer 130 made of Si-doped n-type GaN, a Si-doped n-type confinement layer (first layer 131), a light emitting portion 140, a p-type confinement layer (second layer 151) made of Mg-doped p-type AlGaN, and a p-type contact layer 150 made of Mg-doped p-type GaN are stacked.

Furthermore, on the p-type contact layer 150, a p-side electrode 160 made of, for example, Ni is provided. On the n-type contact layer 130, an n-side electrode 170 made of, for example, a stacked film of Al/Au is provided.

The first barrier layer 141 can include, for example, Si-doped n-type AlGaInN. The second barrier layer 142 can include AlGaInN. The second barrier layer 142 may or may not be doped with Si, or may be partly doped with Si.

In the semiconductor light emitting device 10 according to this embodiment, the band gap of the well layer 143 is smaller than the band gap of the first barrier layer 141 and the second barrier layer 142. Absorption of emission light from the well layer 143 by other semiconductor layers included in the semiconductor light emitting device 10 is suppressed, and the light can be extracted outside with high efficiency. Thus, a semiconductor light emitting device for emitting near ultraviolet light with high efficiency can be realized.

In the following, example configurations of the aforementioned layers will be described. However, this embodiment is not limited thereto. Variously modifications are possible.

The thickness of the first buffer layer 121 can be, for example, approximately 2 micrometers (μm). The thickness of the first AlN buffer layer 121a is, for example, not smaller than 3 nm and not larger than 20 nm. The thickness of the second AlN buffer layer 121b is, for example, approximately 2 μm.

The thickness of the second buffer layer 122 (lattice relaxation layer) can be, for example, 2 μm.

The Si concentration in the n-type contact layer 130 can be, for example, not lower than $5 \times 10^{18}$ cm$^{-3}$ and not higher than $2 \times 10^{19}$ cm$^{-3}$. The thickness of the n-type contact layer 130 can be, for example, approximately 6 μm.

The n-type confinement layer (first layer 131) includes, for example, Si-doped n-type GaN. The Si concentration in the n-type confinement layer can be, for example, approximately $2 \times 10^{18}$ cm$^{-3}$. The thickness of the n-type confinement layer can be, for example, 0.5 μm.

The p-type confinement layer (second layer 151) includes, for example, Mg-doped p-type $Al_{0.25}Ga_{0.75}N$. The thickness of the p-type confinement layer can be, for example, approximately 24 nm. In the p-type confinement layer, the Mg concentration on the second barrier layer 142 side can be, for example, approximately $3 \times 10^{19}$ cm$^{-3}$, and the Mg concentration on the opposite side from the second barrier layer 142 (on the p-side electrode 160 side) can be, for example, $1 \times 10^{19}$ cm$^{-3}$.

In the p-type contact layer 150, the Mg concentration on the p-type confinement layer side can be, for example, approximately $1 \times 10^{19}$ cm$^{-3}$, and the Mg concentration on the opposite side from the n-type confinement layer (on the p-side electrode 160 side in this example) can be, for example, not lower than $5 \times 10^{19}$ cm$^{-3}$ and not higher than $9 \times 10^{19}$ cm$^{-3}$.

The well layer 143 can include, for example, GaInN. The thickness of the well layer 143 is not smaller than 4.5 nm and not larger than 9 nm. The well layer 143 can include, for example, $Ga_{0.93}In_{0.07}N$. The thickness of the well layer 143 can be, for example, approximately 6 nm. Light emitted from the light emitting portion 140 (well layer 143) is near ultraviolet light.

The first barrier layer 141 can include, for example, Si-doped n-type $Al_{0.065}Ga_{0.93}In_{0.005}N$. The Si concentration in the first barrier layer 141 can be, for example, not lower than $1 \times 10^{19}$ cm$^{-3}$ and not higher than $2 \times 10^{19}$ cm$^{-3}$. The thickness of the first barrier layer 141 can be, for example, approximately 13.5 nm.

The second barrier layer 142 can include, for example, $Al_{0.065}Ga_{0.93}In_{0.005}N$. The thickness of the second barrier layer 142 can be, for example, approximately 6 nm.

The semiconductor light emitting device 10 according to this embodiment provides a semiconductor light emitting device that emits near ultraviolet light with high efficiency.

On the basis of experimental results and consideration described below, the inventors have constructed the configuration of a semiconductor light emitting device capable of emitting near ultraviolet light with high efficiency.

Many semiconductor light emitting devices based on nitride semiconductors adopt a multiple quantum well (MQW) structure. The MQW structure has a configuration with a plurality of barrier layers and a plurality of well layers alternately stacked therein.

For example, the MQW structure is adopted also in blue-emitting semiconductor light emitting devices based on nitride semiconductors. In blue-emitting semiconductor light emitting devices, the In composition ratio in the well layer is set to not lower than 0.15 and not higher than 0.25. If the well layer having such a high In composition ratio is formed thick, the crystal quality is prone to degradation. Thus, in blue-emitting semiconductor light emitting devices, the thickness of the well layer is often set to not smaller than 2 nm and not larger than 3 nm. However, if the thickness of the well layer is thin, the effect of confining carriers in the well layer decreases. For this reason, blue-emitting semiconductor light emitting devices adopt the MQW structure with a plurality of well layers stacked therein.

On the other hand, on the basis of the configuration of such blue semiconductor light emitting devices, near ultraviolet semiconductor light emitting devices have been developed. That is, near ultraviolet semiconductor light emitting devices based on the MQW structure are under intensive investigation.

The inventors conducted various studies to increase the efficiency of the near ultraviolet semiconductor light emitting device having the MQW structure. In the experiments performed by the inventors in these studies, the thickness of part of the pairs of barrier layers and well layers in the MQW structure was thinned. That is, the thickness of part of the well layers in the MQW structure was thinned to provide a portion not substantially emitting light, and the light emission efficiency in that case was studied.

Specifically, a crystal strain relaxation layer was formed on an n-type semiconductor layer. In the crystal strain relaxation layer, GaN layers having a thickness of 2.5 nm and GaInN layers having a thickness of 1 nm were alternately stacked. A light emitting portion 140 having the MQW structure was formed on the crystal strain relaxation layer. Further thereon, a p-type semiconductor layer was formed. Thus, a semiconductor light emitting device was formed. The light emission characteristics of this semiconductor light emitting device were evaluated. Here, the number of well layers in the MQW structure of the light emitting portion 140 is, for example, eight. Then, the thickness of part of the pairs of barrier layers (e.g., 5 nm thick) and well layers (e.g., 3.5 nm thick) in the MQW structure was reduced. More specifically, the thickness of the portion corresponding to the barrier layer was set to 2.5 nm, and the thickness of the portion corresponding to the well layer was set to 1 nm. Then, while varying the number of pairs of barrier layers and well layers with reduced thickness, the light emission efficiency was measured.

As the result of this experiment, it turned out that the light emission efficiency in the case of reducing the thickness of part of the pairs of barrier layers and well layers was sometimes comparable to that in the case of not reducing the thickness. Before performing the experiment, it had been predicted that the light emission efficiency would decrease if the number of pairs of barrier layers and well layers in the MQW structure was reduced. However, in the actual result of the experiment, the light emission efficiency was high also in the case where the number of pairs of barrier layers and well layers was small.

By analysis of the cause of this result, it was found that the following phenomenon occurred.

If the number of pairs of barrier layers and well layers is large, the effect of confining carriers may increase, and thereby the light emission efficiency may increase. Furthermore, it was found that if the number of pairs of barrier layers and well layers is large, part of the barrier layers and well layers may function as a buffer layer for enhancing the crystal quality and increase the efficiency.

On the other hand, it was found that if the number of pairs of barrier layers and well layers is large, a plurality of well layers may have nonuniform characteristics and result in decreasing the light emission efficiency. For example, in the case where a plurality of well layers are provided, the well layer near the p-type semiconductor layer and the well layer near the n-type semiconductor layer are different in carrier injection efficiency. Thus, the light emission efficiency varies among a plurality of well layers.

Furthermore, it turned out that light emitted in one well layer may be absorbed by another well layer and result in decreasing the efficiency.

Thus, the inventors noticed that a high light emission efficiency can be achieved even if the number of pairs of barrier layers and well layers in the MQW structure is reduced. By analysis of the cause of this result, the inventors found the following phenomenon. That is, a plurality of well layers have nonuniform characteristics, and light emitted in one well layer is absorbed in another well layer. Furthermore, the inventors found that this phenomenon substantially restricts the efficiency increase in the MQW structure.

On the other hand, various measures were also investigated for achieving uniformity in the characteristics of a plurality of well layers in the MQW structure. However, practically, it is difficult to significantly enhance the uniformity in the characteristics of a plurality of well layers as compared with the current situation.

Through investigation on the cause of hindrance to the efficiency increase in the MQW structure, the inventors have inferred that the structure not including a plurality of well layers is eventually more favorable in some cases. The inventors actually fabricated near ultraviolet semiconductor light emitting devices including a single well layer and evaluated the characteristics thereof. Then, a higher light emission efficiency than in the MQW structure was achieved.

Thus, on the basis of the experimental results and their analysis described above, new findings have been obtained on the phenomenon of nonuniformity and optical absorption in a plurality of well layers. The configuration of this embodiment has been constructed on the basis of these findings.

More specifically, the semiconductor light emitting device 10 according to this embodiment includes a first layer 131 including at least one of n-type GaN and n-type AlGaN, a second layer 151 including p-type AlGaN, and a light emitting portion 140 provided between the first layer 131 and the second layer 151 and having a single well structure.

Thus, there is no decrease of efficiency due to nonuniformity in a plurality of well layers and absorption of emission light from one well layer by another well layer. Thus, a semiconductor light emitting device that emits near ultraviolet light with high efficiency is obtained.

In this embodiment, a single well layer 143 is provided. Hence, there is no nonuniformity in carrier injection efficiency caused in the case of a plurality of well layers.

In this embodiment, the band gap of the well layer 143 is smaller than the band gap of the other layers (e.g., first barrier layer 141, second barrier layer 142, layers including GaN, and layers including AlGaN). That is, in this embodiment, there is a single layer having a small band gap (well layer 143), and the band gap of other layers is larger. Hence, absorption of emission light from the well layer 143 by other layers is suppressed. Thus, emission light is efficiently extracted outside.

On the other hand, in the case of a multiple quantum well structure including a plurality of well layers 143, for example, even if the plurality of well layers 143 have smaller band gaps than other layers, the plurality of well layers 143 have substantially the same band gap. Hence, light emitted in one well layer 143 may be absorbed in another well layer 143. This decreases the efficiency.

Here, as described above, in a semiconductor light emitting device that emits blue light (the peak wavelength of emission is, for example, not shorter than 450 nm and not longer than 480 nm), the In composition ratio in the well layer is high. Hence, if a well layer having a thickness of 4.5 nm or larger is formed, an excessive strain occurs due to lattice mismatch between the GaN layer and the well layer. This decreases the crystal quality and decreases the light emission intensity. On the other hand, if the thickness of the well layer is thinner than 4.5 nm, confinement of carriers in the well layer is weak. Thus, a well layer with high light emission efficiency cannot be formed in the SQW structure. As a result, the MQW structure is adopted.

In contrast, in the semiconductor light emitting device 10 according to this embodiment, for emission of near ultraviolet light, the thickness of the well layer 143 is set to not smaller than 4.5 nm and not larger than 9 nm. This is thicker than in the case of blue light emission. Thus, even in the SQW structure, the effect of confining carriers in the well layer 143 is sufficiently high. Furthermore, because the well layer 143 is single, there is no nonuniformity of carriers in a plurality of well layers. This single well layer 143 can be based on the specification with optimal characteristics. As a result, the light emission efficiency in the well layer 143 can be maximized. Furthermore, the well layer does not suffer the phenomenon of absorption occurring in a plurality of well layers. Hence, the light extraction efficiency can also be increased.

Thus, the semiconductor light emitting device 10 according to this embodiment can realize a semiconductor light emitting device that emits near ultraviolet light with high efficiency.

In this embodiment, the well layer 143 includes, for example, $Ga_{0.93}In_{0.07}N$. The thickness of the well layer 143 is not smaller than 4.5 nm and not larger than 9 nm.

According to the inventors' investigation, if the thickness of the well layer 143 is smaller than 4.5 nm, the light emission intensity is significantly low. If the thickness of the well layer 143 is larger than 9 nm, the light emission spectrum is broadened and the light emission intensity significantly decreases. By setting the thickness of the well layer 143 to not smaller than 4.5 nm and not larger than 9 nm, high light emission efficiency and good spectral characteristics are obtained.

In the case where the thickness of the well layer 143 is smaller than 4.5 nm, it is considered that spread of carriers from the well layer 143 to the barrier layer (e.g., at least one of the first barrier layer 141 and the second barrier layer 142) increases and results in decreasing the efficiency. If the thickness of the well layer 143 exceeds 9 nm, lattice mismatch between the GaN layer (e.g., second buffer layer 122, n-type contact layer 130, Si-doped n-type confinement layer, and the like) and the well layer 143 increases. Thus, it is inferred that an excessive strain is applied to the crystal and decreases the crystal quality.

In particular, in the case where the thickness of the well layer 143 was not smaller than 5 nm and not larger than 7 nm, the light emission intensity was nearly constant, and variation in the spectrum was small. When the thickness of the well layer 143 is 5 nm or larger, the light emission intensity is nearly constant. Hence, it is inferred that carriers exist generally in the well layer 143. When the thickness of the well layer 143 is 7 nm or smaller, spectral broadening scarcely occurs. Hence, it is inferred that no decrease in crystallinity due to strain occurs nearly in the entire region (e.g., entire region of the well layer 143) even if the shape, composition, and the like of the crystal include fluctuations.

In this embodiment, the configuration described above can be realized because the well layer 143 includes GaInN so that the light emitted from the light emitting portion 140 (well layer 143) is near ultraviolet light, i.e., the emission light is near ultraviolet light having a peak wavelength of, for example, not shorter than 380 nm and not longer than 400 nm.

In the semiconductor light emitting device and the wafer according to this embodiment, a thick GaN layer is formed. Hence, light having higher energy than the absorption edge wavelength of GaN is strongly absorbed. For an emission wavelength of 380 nm or longer, a single quantum well layer having a small band gap is provided in the semiconductor light emitting device and the wafer according to this embodiment. This makes it possible to enjoy the effect of realizing a semiconductor light emitting device and a wafer with high light emission efficiency.

Furthermore, for an emission wavelength of 400 nm or shorter, the In composition ratio in GaInN of the well layer 143 does not need to be increased, and the well layer 143 can be thickened. Hence, even in a single well layer, current can be efficiently injected. Thus, there is no optical absorption in the device, and high efficiency is achieved. Furthermore, at a practical value of the current, the decrease of the efficiency of current injection into the light emitting layer (well layer 143) is small. Thus, a semiconductor light emitting device with high efficiency and high optical output power can be realized.

Upon further investigation on the structure of the semiconductor light emitting device 10 according to this embodiment, an additional effect of increasing the light emission efficiency in view of crystal quality has been found besides the aforementioned effect of solving the problem of carrier nonuniformity and reabsorption in a plurality of well layers. That is, in this embodiment, because the well layer is single, the other layers can be optimized so as to maximize the crystal quality of the well layer.

According to the inventors' experiment, the following findings have been obtained. In the case where a semiconductor light emitting device based on nitride semiconductors (e.g., GaN) is provided on a sapphire substrate, crystal defects are generated in the GaN crystal (e.g., GaN buffer layer) due to lattice mismatch between the sapphire substrate and GaN. The influence of such defects is reduced by stacking a highly strained layer on the GaN layer. Furthermore, if an MQW structure including a plurality of well layers made of GaInN is formed on the highly strained layer, strain occurs because the lattice constant of the well layer is different from that of the GaN layer. Thus, the influence of crystal defects is reduced by the plurality of well layers. That is, by stacking a plurality of well layers, with the increase in the number of stacked well layers, a high quality crystal less influenced by crystal defects can be grown. However, if the total thickness of the lattice-mismatched layer is large, the amount of strain excessively increases, and the crystal quality decreases again.

According to the inventors' experiment, the following findings have also been obtained. In a wafer (semiconductor light emitting device) using Ga(Al)InN for the light emitting layer, sensitivity to crystal quality significantly varies with emission wavelength. Specifically, on the long wavelength side above a wavelength of 400 nm, variation in the light emission efficiency is small even if the crystal quality decreases. However, on the short wavelength side of 400 nm or shorter, the light emission efficiency sharply decreases with the decrease of emission wavelength. More specifically, at short wavelengths of 400 nm or shorter, the short wavelength side of each spectrum decreases as if it cannot exceed a kind of envelope. Thus, the light emission efficiency decreases as the emission wavelength is made shorter. However, in high quality crystals, the decrease of light emission efficiency is limited even if the emission wavelength is a short wavelength of 400 nm or shorter. In this case, if the wavelength (peak wavelength) is a short wavelength, the entire spectrum is shifted to the short wavelength side without significant variation. Thus, in particular, by realizing the growth of high quality crystals, light emission with high efficiency particularly in the near ultraviolet wavelength range at wavelengths of 400 nm or shorter can be achieved.

On the basis of these experimental results, the inventors have inferred that only a single well layer can be formed with good crystal quality. Furthermore, the inventors have inferred that the light emission efficiency is maximized by optimizing each layer included in the semiconductor light emitting device so as to maximize the crystal quality of the single well layer. Furthermore, the inventors have inferred that this method enables highly efficient light emission even in a semiconductor light emitting device that emits near ultraviolet light with a wavelength of 400 nm or shorter. This is particularly suitable for application of high quality crystals.

That is, in this embodiment, the overall condition can be optimized so as to maximize the crystal quality of the single well layer 143. Then, the condition for each semiconductor layer included in the semiconductor light emitting device is optimized so that carriers can be injected in the single well layer 143 under the optimal condition.

Thus, by using a single well layer with homogeneous and optimal characteristics, light emission and light extraction can be performed more efficiently than in the case of using a plurality of well layers. That is, because the light emitting portion 140 includes a single well layer 143, the semiconductor light emitting device can be designed and manufactured so as to optimize the characteristics of the single well layer 143. Thus, the characteristics of the light emitting portion 140 can be optimized. As described above, the semiconductor light emitting device 10 according to this embodiment can provide a semiconductor light emitting device that emits near ultraviolet light with high efficiency.

In the following, an example method for manufacturing the semiconductor light emitting device 10 according to this embodiment will be described.

First, by metal organic chemical vapor deposition, an AlN film constituting a first buffer layer 121 is formed with a thickness of approximately 2 µm on a substrate 110 having a surface made of a sapphire c-plane. Specifically, a high carbon concentration first AlN buffer layer 121a (with a carbon concentration of, for example, not lower than $3\times10^{18}$ cm$^{-3}$ and not higher than $5\times10^{20}$ cm$^{-3}$) is formed with a thickness of not smaller than 3 nm and not larger than 20 nm. Furthermore, a high purity second AlN buffer layer 121b (with a carbon concentration of not lower than $1\times10^{16}$ cm$^{-3}$ and not higher than $3\times10^{18}$ cm$^{-3}$) is formed thereon with a thickness of 2 μm. Subsequently, as a second buffer layer 122 (lattice relaxation layer), a non-doped GaN film is formed thereon with a thickness of 2 μm. Subsequently, as an n-type contact layer 130, a Si-doped n-type GaN film with a Si concentration of not lower than $1\times10^{19}$ cm$^{-3}$ and not higher than $2\times10^{19}$ cm$^{-3}$ is formed with a thickness of 6 μm. Furthermore, as an n-type confinement layer (first layer 131), a Si-doped n-type GaN layer with a Si concentration of $2\times10^{18}$ cm$^{-3}$ is formed with a thickness of 0.5 μm. Further thereon, as a first barrier layer 141, a Si-doped n-type $Al_{0.065}Ga_{0.93}In_{0.005}N$ film with a Si concentration of not lower than $0.5\times10^{19}$ cm$^{-3}$ and not higher than $2\times10^{19}$ cm$^{-3}$ is formed with a thickness of 13.5 nm. Furthermore, as a well layer 143, a GaInN film is formed with a thickness of 6 nm. Furthermore, as a second barrier layer 142, an $Al_{0.065}Ga_{0.93}In_{0.005}N$ film is formed with a thickness of 6 nm. Further thereon, as a p-type confinement layer (second layer 151), a Mg-doped p-type $Al_{0.25}Ga_{0.75}N$ film (the Mg concentration is $1.8\times10^{19}$ cm$^{-3}$ on the second barrier layer 142 side and $1\times10^{19}$ cm$^{-3}$ on the opposite side from the second barrier layer 142) is formed with a thickness of 24 nm. Furthermore, as a p-type contact layer 150, a Mg-doped p-type GaN film (the Mg concentration is $1\times10^{19}$ cm$^{-3}$ on the second layer 151 side and not lower than $5\times10^{19}$ cm$^{-3}$ and not higher than $9\times10^{19}$ cm$^{-3}$ on the opposite side from the second layer 151) is formed. Thus, the foregoing layers are sequentially stacked.

Then, the semiconductor layer stacked body including these semiconductor layers is provided with electrodes by, for example, a method illustrated below.

As shown in FIG. 1, in a partial region of the semiconductor layer stacked body, the p-type semiconductor layers and the light emitting portion 140 are removed by dry etching using a mask until the n-type contact layer 130 is exposed to the surface. Then, by using a thermal CVD (chemical vapor deposition) apparatus, an $SiO_2$ film, not shown, is formed with a thickness of 400 nm entirely on the semiconductor layer stacked body including the exposed surface of the n-type semiconductor layer.

Then, a p-side electrode 160 is formed. More specifically, first, a patterned resist for resist lift-off is formed on the semiconductor layer stacked body. The $SiO_2$ film on the p-type contact layer 150 is removed by ammonium fluoride treatment. On this region exposed by removing the $SiO_2$ film, as a p-side electrode 160, a reflective conductive film of Ag is formed by, for example, a vacuum evaporation apparatus with a film thickness of 200 nm, and sintered in a nitrogen atmosphere at 350° C. for 1 minute.

Then, an n-side electrode 170 is formed. More specifically, a patterned resist for resist lift-off is formed on the semiconductor layer stacked body. The $SiO_2$ film on the exposed n-type contact layer 130 is removed by ammonium fluoride treatment. On this region exposed by removing the $SiO_2$ film, for example, a stacked film of Ti film/Pt film/Au film is formed with a film thickness of 500 nm as an n-side electrode 170.

Alternatively, the n-side electrode 170 can include a high reflectance silver alloy (e.g., containing Pd at approximately 1%). In this case, to improve ohmic contact, the n-type contact layer 130 is formed in a two-layer structure. As an electrode formation portion, a high concentration layer having a Si concentration of not lower than $1.5\times10^{19}$ cm$^{-3}$ and not higher than $3\times10^{19}$ cm$^{-3}$ is grown with a thickness of approximately 0.3 μm. This can suppress the reliability decrease due to Si segregation.

Next, the rear surface of the substrate 110 (the surface on the opposite side from the first buffer layer 121) is ground.

The substrate 110 and the semiconductor layer stacked body are cut by, for example, cleavage or diamond blade cutting. Thus, a singulated LED element with, for example, a width of 400 μm and a thickness of 100 μm, i.e., a semiconductor light emitting device 10 according to this embodiment, is fabricated.

The semiconductor light emitting device 10 according to this embodiment includes semiconductor layers including an n-type semiconductor layer, a p-type semiconductor layer, and a light emitting portion 140 provided between the n-type semiconductor layer and the p-type semiconductor layer. Although the materials of these semiconductor layers are not particularly limited, gallium nitride-based compound semiconductors, for example, such as $Al_{\alpha 1}Ga_{1-\alpha 1-\beta 1}In_{\beta 1}N$ ($\alpha 1 \geq 0$, $\beta 1 \geq 0$, $\alpha 1 + \beta 1 \leq 1$) can be used. That is, the semiconductor layers in this embodiment can include nitride semiconductors.

Although the method for forming these semiconductor layers is not particularly limited, techniques such as metal organic chemical vapor deposition and molecular beam epitaxy can be used.

Although it is not particularly limited, a substrate such as sapphire, SiC, GaN, GaAs, and Si is used for the substrate 110. The substrate 110 may be finally removed.

The semiconductor light emitting device 10 according to this embodiment achieves highly efficient light emission in the near ultraviolet range by taking advantage of the low defect crystal. The highly efficient light emission is realized by increasing the efficiency of the light emitting portion 140 itself and suppressing the overflow of electrons from the light emitting portion 140. To this end, the semiconductor light emitting device 10 is based on a configuration facilitating use of a p-type confinement layer (second layer 151) with high Al composition ratio and large film thickness.

In the following, this configuration will be described.

First, the relationship between the Si concentration distribution in the first barrier layer 141 and the second barrier layer 142 and the piezoelectric field applied to the well layer 143 will be described.

A piezoelectric field is applied to the well layer 143. Hence, at the interface between the well layer 143 and the second barrier layer 142, positive charges penetrate from the well layer 143 into the second barrier layer 142. On the other hand, at the interface between the well layer 143 and the first barrier layer 141, negative charges penetrate from the well layer 143 into the first barrier layer 141.

The p-type confinement layer (second layer 151) side of the well layer 143 contains many electrons. Thus, supply of electrons thereto from the second barrier layer 142 may be low. Hence, in the barrier layer in contact with this interface (second barrier layer 142), the Si concentration may be low. That is, the second barrier layer 142 may not be intentionally doped with Si.

On the other hand, the n-type confinement layer (first layer 131) side of the well layer 143 does not contain many electrons. Thus, it is desired to efficiently supply electrons from the first barrier layer 141 side toward the well layer 143. Hence, in the first barrier layer 141 in contact with this interface, the Si concentration is preferably set to a high level. That is, the first barrier layer 141 is highly doped with Si. Specifically, the Si concentration in the first barrier layer 141 is preferably not lower than $0.5\times10^{19}$ cm$^{-3}$ and not higher than $2\times10^{19}$ cm$^{-3}$. Furthermore, the Si concentration set to not lower than $1.0\times10^{19}$ cm$^{-3}$ and not higher than $1.2\times10^{19}$ cm$^{-3}$ enables high concentration electron supply without degrading the crystal. In the Si concentration range of not lower than $1.2\times10^{19}$ cm$^{-3}$ and not higher than $1.5\times10^{19}$ cm$^{-3}$, there may occur broadening of the emission spectrum, presumably associated with crystal degradation. However, electron supply can be increased, and the light emission intensity is high.

The second barrier layer 142 with low Si concentration is located on the p-type confinement layer (second layer 151) side of the well layer 143. The first barrier layer 141 with high Si concentration is located on the n-type confinement layer (first layer 131) side of the well layer 143. In other words, in the light emitting portion 140, the Si concentration increases from the p-type confinement layer (second layer 151) side toward the n-type confinement layer (first layer 131) side.

As described above, the light emission efficiency can be increased by varying the Si concentration between in the first barrier layer 141 and in the second barrier layer 142.

In addition, the half-width of the emission spectrum can be reduced.

In the following, the relationship between the Si concentration and the emission spectrum will be described.

At the interface of the first barrier layer 141 in contact with the well layer 143, a large amount of electrons flow from the highly doped Si into the well layer 143 and a large amount of charged Si remain on the first barrier layer 141 side. The distribution of electron concentration and Si concentration at this interface serves to cancel the piezoelectric field. As a result, the piezoelectric field is weakened. If the piezoelectric field is weakened, the energy band of the light emitting portion 140 bent by the piezoelectric field is flattened. Thereby, the light emission efficiency is improved. Furthermore, the half-width of the emission spectrum is narrowed.

Here, in the case where the light emitting portion 140 includes a plurality of well layers, barrier layers doped with n-type impurity are interposed between the plurality of well layers. This tends to cause the problem of the piezoelectric effect occurring differently in the plurality of well layers. However, in this embodiment, because the light emitting portion 140 includes a single well layer 143, this problem does not occur. Thus, the second barrier layer 142 has a low concentration of n-type impurity or is not intentionally doped with the n-type impurity. On the other hand, the first barrier layer 141 is highly doped with n-type impurity.

That is, in the case where a plurality of well layers are provided, a restriction is imposed thereon to achieve a uniform carrier concentration distribution in the plurality of well layers. However, in this embodiment, this restriction is eliminated, and the design of impurity concentration has greater flexibility and allowance. That is, the second barrier layer 142 only needs to be doped with n-type impurity at low concentration or may not be intentionally doped therewith. The first barrier layer 141 only needs to be doped with n-type impurity at high concentration. By such a simple design, a good carrier distribution can be obtained.

As described above, in the semiconductor light emitting device 10 according to this embodiment, the light emission efficiency is increased by controlling the impurity concentration in the light emitting portion 140 and thereby controlling the electric field in the light emitting portion 140. Thus, this embodiment can provide a semiconductor light emitting device that emits near ultraviolet light with high efficiency.

Next, effects of improving the reliability and reducing the driving voltage by controlling the Si concentration will be described.

In the semiconductor light emitting device 10 according to this embodiment, the Si concentration in the second barrier layer 142 is made lower than the Si concentration in the first barrier layer 141. Thus, the reliability can be improved, and the driving voltage of the semiconductor light emitting device 10 can be reduced.

By lowering the Si concentration in the second barrier layer 142, the overflow of electrons from the well layer 143 toward the p-type confinement layer (second layer 151) decreases. Hence, the reliability of the semiconductor light emitting device is improved.

Furthermore, by lowering the Si concentration in the second barrier layer 142, the energy barrier height of the second barrier layer 142 is lowered. This makes it difficult for holes to enter the second barrier layer 142 and is effective for voltage reduction in the semiconductor light emitting device 10.

Thus, the Al composition ratio in the p-type confinement layer (second layer 151) can be decreased, and the reliability of the device is improved. For example, if the Si concentration in the second barrier layer 142 is approximately $1 \times 10^{19}$ cm$^{-3}$, the Al composition ratio in the p-type confinement layer (second layer 151) needs to be 25% or higher. However, if the second barrier layer 142 is not doped with Si, the Al composition ratio in the p-type confinement layer (second layer 151) can be reduced to 20%.

As described above, in the semiconductor light emitting device 10 according to this embodiment, the light emission efficiency is increased by lowering the Si concentration in the second barrier layer 142. Thus, this embodiment can provide a semiconductor light emitting device that emits near ultraviolet light with high efficiency, high reliability, and low driving voltage.

Here, the Si concentration in the second barrier layer 142 may be uniform, or, for example, the Si concentration may vary along a thickness direction. For example, the second barrier layer 142 may include a first portion having a high Si concentration and a second portion having a low Si concentration. In this case, the Si concentration distribution may vary either stepwise or continuously as long as the Si concentration in the second barrier layer 142 is lower than in the first barrier layer 141.

In the following, each layer of the semiconductor light emitting device 10 according to this embodiment will be described in detail.

The high carbon concentration first AlN buffer layer 121a serves to relax the difference in crystal type from the substrate 110 and particularly reduces screw dislocations. Furthermore, the high purity second AlN buffer layer 121b serves to flatten the surface at the atomic level. This reduces crystal defects in the non-doped GaN buffer layer (second buffer layer 122) grown thereon. To this end, the film thickness of the high purity second AlN buffer layer 121b is preferably thicker than 1 μm. Furthermore, to prevent warpage due to strain, the thickness of the high purity second AlN buffer layer 121b is preferably 4 μm or smaller.

Here, the first buffer layer 121 can include AlN as described above. However, this embodiment is not limited thereto. For example, the first buffer layer 121 may include $Al_{\alpha 2}Ga_{1-\alpha 2}N$ ($0.8 \leq \alpha 2 \leq 1$). In this case, the wafer warpage can be compensated by adjusting the Al composition ratio.

The second buffer layer 122 (lattice relaxation layer) is formed by three-dimensional island growth on the first buffer layer 121, and thereby serves for defect reduction and strain relaxation. To flatten the growth surface, the average thickness of the second buffer layer 122 (lattice relaxation layer) is preferably 0.6 μm or larger. From the viewpoint of reproducibility and warpage reduction, the thickness of the second buffer layer 122 (lattice relaxation layer) is preferably not smaller than 0.8 μm and not larger than 2 μm.

By adopting these buffer layers, the dislocation density can be reduced to 1/10 or less as compared with conventional buffer layers formed by low-temperature growth. This enables crystal growth at such high growth temperature and high ratio of group V raw material to group III raw material that are otherwise difficult to adopt due to abnormal growth. Thus, generation of point defects is suppressed. This enables high concentration doping of the AlGaN layer and the barrier layers (first barrier layer 141 and second barrier layer 142) having high Al composition ratio.

As described above, the first barrier layer 141 includes, for example, a Si-doped quaternary mixed crystal AlGaInN (the Al composition ratio is not lower than 6% and not higher than 10%, and the In composition ratio is not lower than 0.3% and not higher than 1.0%). The second barrier layer 142 includes, for example, a quaternary mixed crystal AlGaInN (the Al composition ratio is not lower than 6% and not higher than 10%, and the In composition ratio is not lower than 0.3% and not higher than 1.0%), optionally doped with Si. The well layer 143 includes, for example, $In_{0.05}Ga_{0.95}N$ (the In composition ratio can be varied as appropriate in the range of not lower than 4% and not higher than 10%).

The emission wavelength of the light emitting portion 140 is not shorter than 380 nm and not longer than 400 nm.

The absorption edge of GaN is approximately 365 nm. Hence, the emission wavelength is set to 380 nm or longer where absorption by GaN is not high. To suppress absorption in the GaN layer and increase the light emission efficiency, the emission wavelength is preferably not shorter than 380 nm and not longer than 400 nm.

In the case where the emission wavelength is 400 nm or shorter, the In composition ratio of the GaInN layer constituting the well layer 143 can be reduced, and the thickness of the well layer 143 can be set to 4.5 nm or larger.

More preferably, the emission wavelength is not shorter than 390 nm and not longer than 400 nm. In this case, the thickness of the well layer 143 can be set to 5.5 nm or larger. This increases the light emission efficiency and suppresses the efficiency decrease associated with the increase of optical output power and the efficiency decrease associated with the increase of operating temperature.

To form a deep potential for efficiently causing ultraviolet light emission with an emission wavelength of not shorter than 380 nm and not longer than 400 nm, the Al composition ratio in the first barrier layer 141 and the second barrier layer 142 is set to 6% or higher.

The thickness of the second barrier layer 142 is set to 3 nm or larger. This is because the thickness of the second barrier layer 142 smaller than 3 nm causes the problem of the emission wavelength of the well layer 143 varying under the influence of the p-type AlGaN layer. To control the characteristics of the well layer 143 in consideration of the influence of impurity diffusion, the thickness of the second barrier layer 142 is set to 4.5 nm or larger. In particular, if the thickness of the second barrier layer 142 is larger than the thickness of the well layer 143, the effect of relaxing the influence of the strain between the AlGaN layer and the well layer 143 is high. Here, the second barrier layer 142 being excessively thick causes the increase of device resistance. Furthermore, if the second barrier layer 142 is excessively thick, carriers overflowed from the well layer 143 are accumulated and cause absorption. To reduce this influence, the second barrier layer 142 is preferably thinner than the first barrier layer 141. The semiconductor light emitting device with the thickness of the second barrier layer 142 being 9 nm or smaller was successfully operated with a voltage increase within 10% of the operating voltage anticipated from the emission wavelength.

The thickness of the first barrier layer 141 can be set to a value in the range of, for example, not smaller than 4.5 nm and not larger than 30 nm. If the thickness of the first barrier layer 141 is 4.5 nm or larger, the inherent property of the material is manifested, and the effect of suppressing hole overflow is achieved. In the case where the thickness of the first barrier layer 141 is 30 nm or smaller, a high quality crystal can be grown relatively easily.

Furthermore, the thickness of the first barrier layer 141 is preferably larger than the thickness of the well layer 143. By making the thickness of the first barrier layer 141 larger than the thickness of the well layer 143, carrier supply to the well layer 143 is effectively controlled. In particular, the thickness of the first barrier layer 141 is preferably not less than twice the thickness of the well layer 143. By setting the thickness of the first barrier layer 141 to not less than twice the thickness of the well layer 143, carriers can be supplied to both sides of the first barrier layer 141, and the accuracy of carrier supply to the well layer 143 is enhanced. Here, as described above, by highly doping the first barrier layer 141 with Si, the influence of the piezoelectric field applied to the well layer 143 can be reduced, and light emission can be obtained with high efficiency.

If the Al composition ratio in the first barrier layer 141 and the second barrier layer 142 exceeds 10%, the crystal quality is degraded. Doping the first barrier layer 141 and the second barrier layer 142 with a small amount of In has the effect of improving the crystal quality. This effect is observed when the In composition ratio in the first barrier layer 141 and the second barrier layer 142 is 0.3% or higher. However, if the In composition ratio exceeds 1.0%, the crystal quality is degraded, and the light emission efficiency decreases. However, if the thickness is small, the In composition ratio can be increased up to 2%.

For example, in this embodiment, in the case where the film thickness of the first barrier layer 141 is 15 nm or larger, the highest In composition ratio is limited to approximately 1%. However, if the first barrier layer 141 is thinned to 7 nm, then even for an In composition ratio of 2%, the crystal is not degraded, and intense light emission is obtained.

Next, the growth technique for the first barrier layer 141 will be described.

A quaternary mixed crystal AlGaInN layer with good crystal quality is difficult to grow. Furthermore, the crystal is prone to degradation if it is highly doped with Si. Through investigation on the LED device structure and optimization of growth conditions, the inventors have successfully increased the In composition ratio of the barrier layer 141 made of AlGaInN without degrading the crystal quality.

For example, as described above, in this embodiment, if the film thickness of the first barrier layer 141 exceeds 15 nm, the highest In composition ratio is limited to approximately 1%. However, if the first barrier layer 141 is thinned to 7 nm, then even for an In composition ratio of 2%, the crystal is not degraded, and intense light emission is obtained.

With the increase of In composition ratio, the interface with the well layer 143 made of GaInN can be made steeper. Thus, the crystallinity of the well layer 143 is enhanced. Consequently, the first barrier layer 141 made of AlGaInN can be doped with Si at high concentration.

Furthermore, by decreasing the film thickness of the highly Si-doped first barrier layer 141, the first barrier layer 141 can be doped with Si at higher concentration.

Comparing between the first barrier layer 141 and the second barrier layer 142, the Al composition ratio of the first barrier layer 141 may be high. In this case, the first barrier layer 141 has a larger band gap. This increases the effect of confining holes. Thus, when the injection current is increased, the current leakage is reduced, and the optical output power can be increased. For electrons, the second layer 151 (p-type AlGaN layer) serves as a barrier. Hence, the Al composition ratio of the second barrier layer 142 is made sufficiently lower than that of the second layer 151.

For example, the Al composition ratio of the first barrier layer 141 can be set to 8% or higher, and the Al composition ratio of the second barrier layer 142 can be set to 7%. In this case, after the first barrier layer 141 is grown at a high temperature, the well layer 143 and the second barrier layer 142 may be grown at a growth temperature lower than the high temperature. Thus, because the first barrier layer 141 with high Al composition ratio is grown at high temperature, the first barrier layer 141 can be grown as a high quality crystal. On the other hand, the well layer 143 and the second barrier layer 142 with low Al composition ratio are grown at low temperature so that the well layer 143 with, for example, high In composition ratio can be grown with good characteristics.

Here, after the second barrier layer 142 is grown to a thickness enough to protect the surface of the well layer 143, the second barrier layer 142 may be grown at a higher temperature.

For example, the first barrier layer 141 may have a two-layer structure as a combination of an AlGaN layer with high Al composition ratio and an AlGaInN layer with low Al composition ratio. In such a structure, hole overflow can be suppressed by the AlGaN layer. Furthermore, by the AlGaInN layer, the characteristics of the crystal surface can be improved, and the well layer 143 can be formed on the crystal surface with improved characteristics. In this case, the AlGaN layer and part of the AlGaInN layer may be grown at a high temperature, and the rest of the AlGaInN layer may be grown at the same temperature as the well layer 143. By such a method, a high quality AlGaN crystal can be grown at high temperature, whereas the well layer 143 can be grown at a temperature suitable for the well layer 143. Such temperature change requires a long period of time and decreases the process efficiency. In the case where the light emitting portion has a multiple quantum well structure, performing such a process on each barrier layer and well layer takes a very long time and decreases the process efficiency. However, in this embodiment, the light emitting portion 140 has a single quantum well structure, and hence requires such a process only once. Thus, such a process can be performed as a practical process sequence.

Second Embodiment

Figure 2:
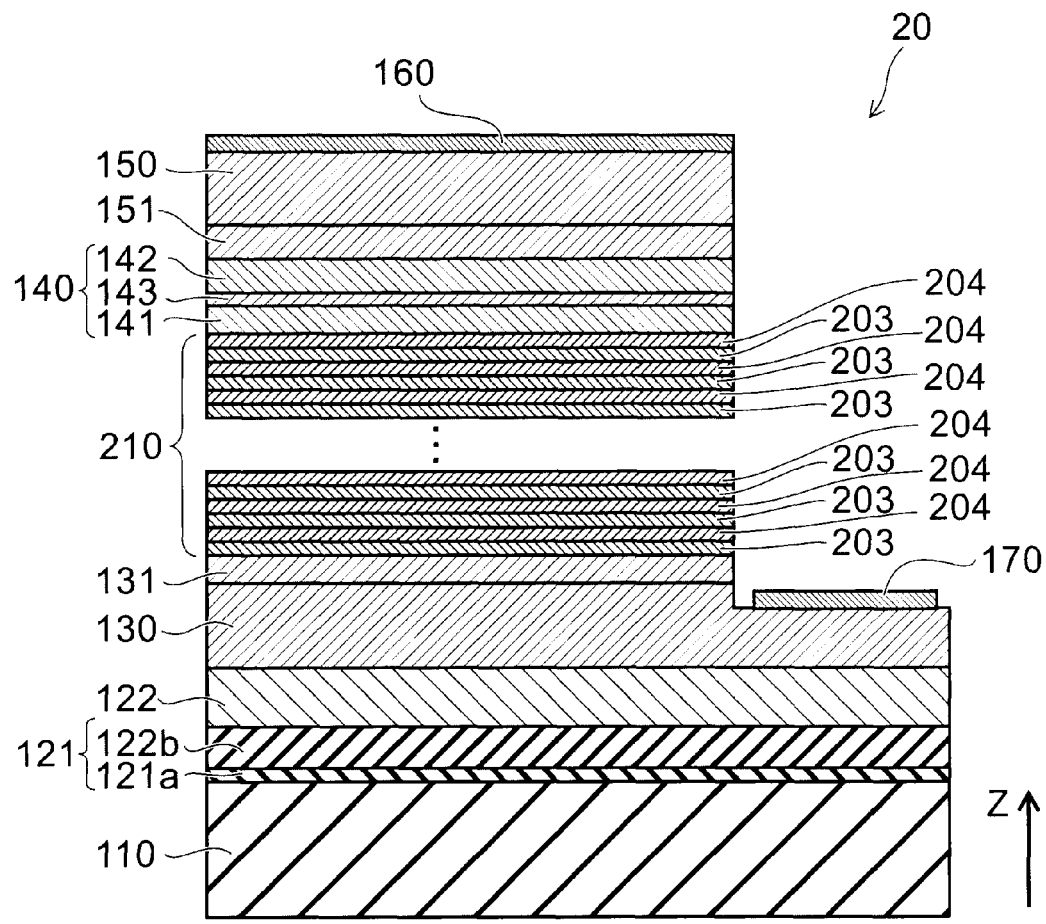
FIG. 2 is a schematic cross-sectional view illustrating the configuration of a semiconductor light emitting device according to a second embodiment.

FIG. 2 is a schematic cross-sectional view illustrating the configuration of a semiconductor light emitting device according to a second embodiment of the invention.

As shown in FIG. 2, in addition to the first layer 131, the second layer 151, and the light emitting portion 140, the semiconductor light emitting device 20 according to this embodiment further includes a first stacked structural body 210 provided between the first layer 131 and the light emitting portion 140.

The first stacked structural body 210 includes a plurality of third layers 203 including AlGaInN and a plurality of fourth layers 204 alternately stacked with the plurality of third layers 203 and including GaInN.

The plurality of third layers 203 and the plurality of fourth layers 204 are stacked along the Z-axis direction.

Each of the plurality of third layers 203 has a smaller thickness than the first barrier layer 141 and the second barrier layer 142. Each of the plurality of fourth layers 204 has a smaller thickness than the well layer 143.

The third layer 203 is, for example, a low strain layer. The fourth layer 204 is, for example, a high strain layer with a higher strain than the third layer 203.

The third layer 203 can be formed with the same composition as, for example, the first barrier layer 141. That is, in the case where the first barrier layer 141 includes $Al_{0.07}Ga_{0.925}In_{0.005}N$, the third layer 203 can include $Al_{0.07}Ga_{0.925}In_{0.005}N$. The thickness of the third layer 203 is, for example, 2 nm. Furthermore, the third layer 203 is doped with Si at, for example, approximately $5 \times 10^{18}$ cm$^{-3}$.

The fourth layer 204 can be formed with the same composition as, for example, the well layer 143. That is, in the case where the well layer 143 includes $Ga_{0.93}In_{0.07}N$, the fourth layer 204 can include $Ga_{0.93}In_{0.07}N$. The thickness of the fourth layer 204 can be, for example, 1 nm.

For example, the number of third layers 203 is 30, and the number of fourth layers 204 is 30. That is, 30 pairs of third layers 203 and fourth layers 204 are stacked.

The configuration other than the foregoing can be made similar to that of the semiconductor light emitting device 10, and hence the description thereof is omitted.

For example, if the third layer 203 is formed with the same composition as the first barrier layer 141, the third layer 203 can be grown under the same condition as the first barrier layer 141. This can facilitate the process. Furthermore, before growing the first barrier layer 141, in the course of growing the third layers 203, a sufficient period of time can be spent to prepare the same growth condition as that for the first barrier layer 141. This serves to enhance the controllability of the first barrier layer 141.

For example, if the fourth layer 204 is formed with the same composition as the well layer 143, the fourth layer 204 can be grown under the same condition as the well layer 143. This can facilitate the process. Furthermore, before growing the well layer 143, in the course of growing the fourth layers 204, a sufficient period of time can be spent to prepare the same growth condition as that for the well layer 143. This serves to enhance the controllability of the well layer 143.

On the other hand, for example, if the fourth layer 204 includes GaInN having a lower In composition ratio and larger band gap than the well layer 143, the absorption of emission light from the well layer 143 by the fourth layers 204 can be reduced. Furthermore, in this case, because of the reduced absorption, the fourth layers 204 can be made thicker, and the number of pairs of third layers 203 and fourth layers 204 can be increased.

Here, the number of pairs of third layers 203 and fourth layers 204 is not limited to 30. The number can be set as appropriate. Furthermore, instead of equalizing the number of third layers 203 with the number of fourth layers 204, the number of third layers 203 can be made larger than the number of fourth layers 204 by adding one more third layer 203. Thus, the plurality of third layers 203 and the plurality of fourth layers 204 may be stacked so as to start with the third layer 203 and end with the third layer 203. Alternatively, the number of fourth layers 204 can be made larger than the number of third layers 203 by adding one more fourth layer 204. Thus, the plurality of third layers 203 and the plurality of fourth layers 204 may be stacked so as to start with the fourth layer 204 and end with the fourth layer 204.

In the first stacked structural body 210 provided in the semiconductor light emitting device 20, the crystal inside the first stacked structural body 210 is strained. Thus, the crystal quality is improved. This enhances the crystal quality of the semiconductor layers provided on the first stacked structural body 210 (e.g., the semiconductor layers in the light emitting portion 140, particularly the well layer 143). Thus, the semiconductor light emitting device 20 can obtain higher light emission efficiency. That is, for example, the configuration of the first stacked structural body 210 is optimized so as to maximize the crystal quality of the well layer 143.

In this embodiment, the well layer 143 in the light emitting portion 140 is lattice-mismatched with the GaN layer. Hence, strain is accumulated in the well layer 143 stacked on the first stacked structural body 210. Here, the number of repetitions of the third layer 203 and the fourth layer 204 stacked in the first stacked structural body 210 can be suitably designed to improve the crystal quality in the first stacked structural body 210. This can also suppress the degradation in the crystal characteristics of the well layer 143 due to the total strain in the first stacked structural body 210 and the well layer 143 beyond the limits.

The sum of the total thickness of the plurality of fourth layers 204 and the thickness of the well layer 143 is, for example, not smaller than 25 nm and not larger than 45 nm. This enables growth of good crystals characterized by high light emission efficiency and small spread of emission spectrum.

In particular, in the case where the sum of the total thickness of the plurality of fourth layers 204 and the thickness of the well layer 143 is not smaller than 30 nm and not larger than 35 nm, a particularly good crystal is obtained.

The reason for this is presumed as follows. When the sum of the total thickness of the plurality of fourth layers 204 and the thickness of the well layer 143 is set to not lower than 25 nm and not larger than 45 nm, the total amount of strain, including composition fluctuations in the crystal, corresponds to around the upper limit in the range of not causing degradation in the crystal.

In the case of using the first stacked structural body 210 including a plurality of third layers 203 and a plurality of fourth layers 204, the inventors have found the following. The direction of crystal dislocations extending from the lower portion of the crystal (e.g., the second buffer layer 122 on the substrate 110 side as viewed from the first stacked structural body 210) to the first stacked structural body 210 varies in the first stacked structural body 210. The direction of dislocations is made close to the direction perpendicular to the c-plane surface of the first stacked structural body 210. That is, the direction of crystal dislocations is made close to the direction perpendicular to the crystal surface (i.e., the stacking direction, or Z-axis direction). This corresponds to the decrease of the length of crystal dislocations in the light emitting portion 140 as viewed in the stacking direction. That is, this corresponds to the decrease of the area of defect regions in the light emitting portion 140 as viewed in the stacking direction.

Thus, it is considered that by adopting the first stacked structural body 210, the quality of the crystal formed on the first stacked structural body 210 can be enhanced. It is inferred that this is the cause of enhanced crystal quality and light emission efficiency in the semiconductor light emitting device 20 based on the first stacked structural body 210.

In this embodiment, on the substrate 110 made of sapphire, an n-type contact layer 130 (n-type GaN layer) is formed on the first buffer layer 121 (AlN layer) and the second buffer layer 122 (non-doped GaN layer) at high temperature. Hence, a high quality GaN crystal with low dislocation density is obtained. Thus, the n-type confinement layer (first layer 131) has good crystal quality. Furthermore, the light emitting portion 140 formed thereon has high crystal quality.

More specifically, in the crystal of the light emitting portion 140 in this embodiment, most dislocations are independent. There are few contacts and entanglements between a plurality of dislocations. This serves to directly manifest the effect of improving the crystal characteristics achieved by the direction of dislocations aligned with the direction perpendicular to the crystal surface. Thus, by the application of the first stacked structural body 210 in conjunction with the aforementioned combination of buffer layers, the effect of improving the crystal quality achieved by the first stacked structural body 210 is manifested more significantly.

Here, in this embodiment, the lower limit of the thickness of the fourth layer 204 is determined as the thickness not smaller than a value at which the fourth layer 204 exhibits its material properties as a continuous layer. The upper limit of the thickness of the fourth layer 204 is determined by the condition for providing a difference between the energy of the absorption edge in the fourth layer 204 and the energy of the absorption edge in the well layer 143.

Specifically, the thickness of the fourth layer 204 is set to, for example, four atomic layers or larger, and not larger than the thickness at which the energy of the absorption edge in the fourth layer 204 is sufficiently larger than that of the absorption edge of the well layer 143. More specifically, the wavelength corresponding to the energy of the absorption edge of the fourth layer 204 is set on the short wavelength side of the wavelength at which the intensity of the emission spectrum of the well layer 143 is half or less the peak value.

On the other hand, in the third layer 203, the Al composition ratio is made comparable to that of the first barrier layer 141 (the Al composition ratio is approximately 10% or lower). This can reduce the resistance of the barrier against electrons between the third layer 203 and the GaN layer, and a high quality crystal can be grown.

In this embodiment, the first barrier layer 141 can have a two-layer structure as a combination of an AlGaN layer having high Al composition ratio and an AlGaInN layer having low Al composition ratio. By such a structure, hole overflow can be suppressed by the AlGaN layer. Furthermore, by the AlGaInN layer, the characteristics of the crystal surface can be improved, and the well layer 143 can be formed on the crystal surface with improved characteristics. For example, as part of the first barrier layer 141, an AlGaN layer (the Al composition ratio is not lower than 20% and not higher than 26%) and an AlGaInN layer (the Al composition ratio is 8%) are grown at a growth temperature increased to 1000° C. Then, an AlGaN layer constituting the rest of the first barrier layer 141, and a well layer 143 can be grown at a lower growth temperature. This enables a semiconductor light emitting device with low hole overflow, high light emission efficiency in the well layer 143, and high optical output power from low current to high current.

Next, a feature of the method for manufacturing a semiconductor device and a wafer according to this embodiment will be described.

To realize a highly efficient semiconductor light emitting device, the well layer 143 for emitting light, and the first barrier layer 141 and the second barrier layer 142 on both sides thereof, are preferably formed by generally continuous growth. This is for the purpose of reducing interface defects generated by interrupting the growth. Here, a heterojunction interface exists at least between the first barrier layer 141 and the well layer 143, and between the well layer 143 and the second barrier layer 142. At this interface, the growth is interrupted to adjust the condition for supplying raw materials. Continuous growth except this interruption time is referred to as generally continuous growth.

In general, in a thin multiple quantum well with a GaInN layer serving as a light emitting layer, the GaInN layer has a high In composition ratio. Thus, crystal growth at low temperature is suitable for the GaInN layer. On the other hand, high growth temperature is desirable for the barrier layer including Al in view of the strong coupling between Al and nitrogen. Thus, if the well layer including GaInN with high In composition ratio and the barrier layer including Al are continuously grown at the same temperature, no growth condition suitable for both the well layer and the barrier layer can be selected. This causes the problem of not being able to grow a high quality crystal.

In the semiconductor light emitting device and the wafer according to this embodiment, the light emitting portion 140 is based on a single thick well layer 143. Hence, the shift of light emission energy due to the quantum effect is small. Thus, the well layer 143 can include a GaInN layer with low In composition ratio and large band gap. This enables growth at high temperature.

On the other hand, doping the barrier layer (first barrier layer 141 and second barrier layer 142) with In facilitates the motion of atoms at the crystal surface during crystal growth. Thus, AlGaInN containing Al can be grown at low temperature. Because of the low intake efficiency of In, a large amount of In raw material is supplied to the crystal surface for slight In doping. This facilitates the motion of atoms at the crystal surface and enables crystal growth at low temperature. That is, in the semiconductor light emitting device and the wafer according to this embodiment, the well layer 143 can be grown at high temperature, and the barrier layers (first barrier layer 141 and second barrier layer 142) can be grown at low temperature. This enables generally continuous growth at generally constant temperature (without intentionally varying the temperature). Thus, in the semiconductor light emitting device and the wafer according to this embodiment, crystal defects at the interface adjacent to the well layer 143 can be reduced.

That is, the semiconductor light emitting device and the wafer according to this embodiment are manufacturing by the method of generally continuous growth of the well layer 143 for emitting light, and the first barrier layer 141 and the second barrier layer 142 on both sides thereof. This makes it possible to form a semiconductor light emitting device and a wafer with high light emission efficiency particularly in the low current region.

Next, an alternative feature of the method for manufacturing a semiconductor light emitting device and a wafer according to this embodiment is described. The alternative feature of the method for manufacturing a semiconductor light emitting device and a wafer according to this embodiment is that the stacked structure (particularly the first stacked structural body 210) can be grown at generally the same temperature as the light emitting portion 140 (well layer 143, first barrier layer 141, and second barrier layer 142).

By providing the first stacked structural body 210, the direction of dislocations in the crystal varies, and it is expected that a well layer 143 with high light emission efficiency can be formed on the first stacked structural body 210. However, if the growth temperature varies between the first stacked structural body 210 and the light emitting portion 140, the propagation direction of defects varies. This causes concern about failing to improve the characteristics of the light emitting portion 140 although the first stacked structural body 210 is provided. Thus, the first stacked structural body 210, the first barrier layer 141, the well layer 143, and the second barrier layer 142 are preferably grown at a generally equal temperature.

As described above, in the semiconductor light emitting device according to this embodiment, the well layer 143 and the barrier layers (first barrier layer 141 and second barrier layer 142) can be grown at generally the same temperature.

On the other hand, the materials of the third layer 203 and the fourth layer 204, for example, of the first stacked structural body 210 can be selected as a pair of materials being similar (e.g., possibly identical) to those of the barrier layer and the well layer 143, respectively, and allowing favorable crystal growth at the same growth temperature as the barrier layer and the well layer 143. Thus, the crystal of the first stacked structural body 210, the first barrier layer 141, the well layer 143, and the second barrier layer 142 with good characteristics can be readily grown at a generally equal temperature.

In a semiconductor light emitting device and a wafer including a large number of stacked layers and having a complex configuration, if the optimal growth condition varies from layer to layer, selection of the condition consumes time. Thus, it is difficult to make a device with good characteristics for substantially all the layers. However, in the semiconductor light emitting device and the wafer according to this embodiment, the stacked structural body, the barrier layers, and the light emitting layer can be grown at a generally equal temperature. This enables a high quality crystal to be readily grown under the appropriate growth condition.

That is, the semiconductor light emitting device and the wafer according to this embodiment can be manufactured by the method of growing the stacked structural body, the barrier layers, and the light emitting layer at a generally equal temperature. This enables a high quality crystal to be readily grown under the appropriate growth condition. Thus, a semiconductor light emitting device and a wafer with high light emission efficiency can be manufactured.

Figure 3:
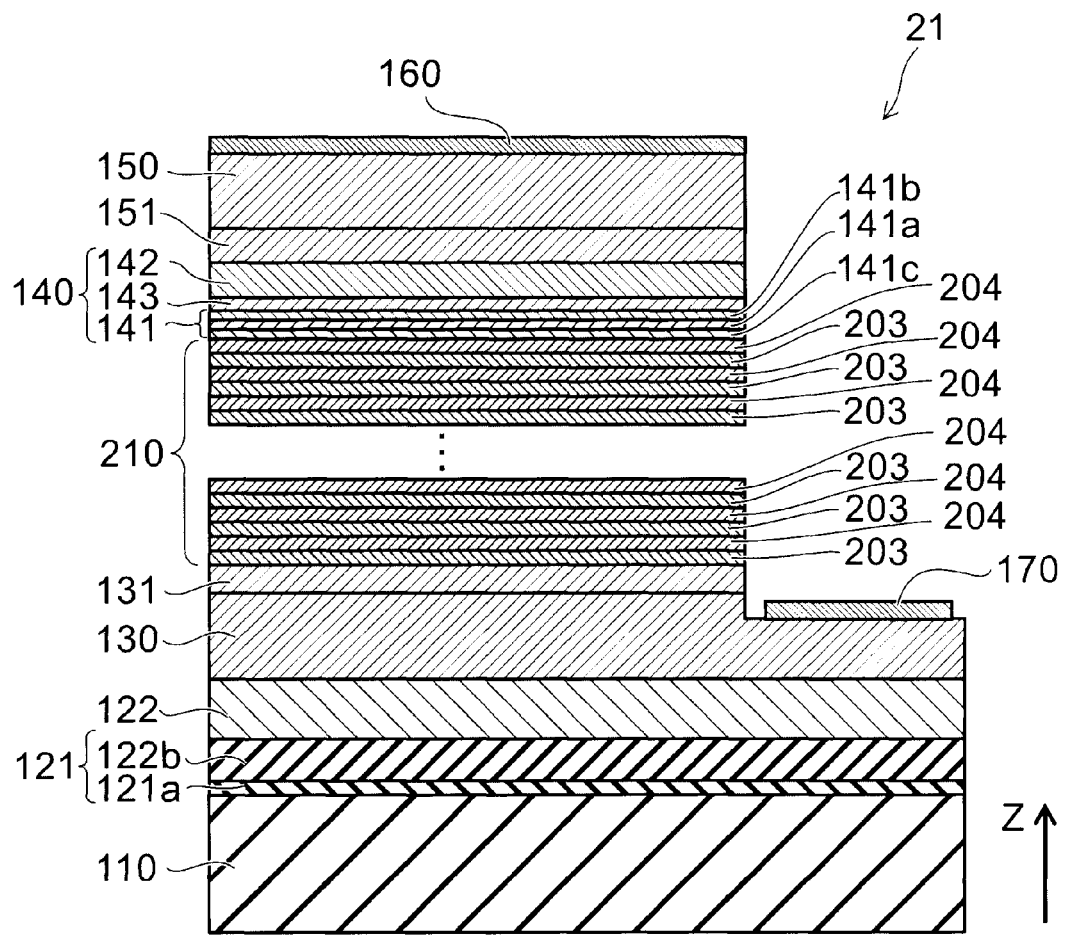
FIG. 3 is a schematic cross-sectional view illustrating the configuration of another semiconductor light emitting device according to the second embodiment.

FIG. 3 is a schematic cross-sectional view illustrating the configuration of one other semiconductor light emitting device according to the second embodiment of the invention.

As shown in FIG. 3, in the one other semiconductor light emitting device 21 according to this embodiment, the first barrier layer 141 has a three-layer structure. The rest can be made similar to the semiconductor light emitting device 20, and hence the description thereof is omitted.

More specifically, the first barrier layer 141 includes a first sublayer 141a provided between the first layer 131 and the well layer 143 (in this example, between the first stacked structural body 210 and the well layer 143), a second sublayer 141b provided between the first sublayer 141a and the well layer 143, and a third sublayer 141c provided between the first sublayer 141a and the first layer 131 (in this example, between the first sublayer 141a and the first stacked structural body 210).

The first sublayer 141a is illustratively an AlGaN layer with high Al composition ratio. The second sublayer 141b is illustratively an AlGaInN layer with low Al composition ratio. The second sublayer 141b has a lower Al composition ratio than the first sublayer 141a. The third sublayer 141c is illustratively an AlGaInN layer with low Al composition ratio. The third sublayer 141c has a lower Al composition ratio than the first sublayer 141a.

The Al composition ratio in the first sublayer 141a is, for example, 15%. The thickness of the first sublayer 141a is, for example, 5 nm.

The Al composition ratio in the second sublayer 141b is, for example, 7%. The thickness of the second sublayer 141b is, for example, 5 nm.

The Al composition ratio in the third sublayer 141c is made equal to, for example, the Al composition ratio in the third layer 203 of the first stacked structural body 210. The thickness of the third sublayer 141c is, for example, 2 nm.

Alternatively, the Al composition ratio in the first sublayer 141a is set to, for example, not lower than 10% and not higher than 26%. The thickness of the first sublayer 141a is set to not lower than 5 nm and not higher than 50 nm. The first sublayer 141a may be doped with Si as n-type impurity at not lower than $5\times10^{17}$ cm$^{-3}$ and not higher than $1\times10^{19}$ cm$^{-3}$.

The Al composition ratio in the second sublayer 141b is set to, for example, not lower than 6% and not higher than 10%. The In composition ratio in the second sublayer 141b is set to, for example, not lower than 0.3% and not higher than 1%. The thickness of the second sublayer 141b is set to, for example, not smaller than 3 nm and not larger than 15 nm. Here, the second sublayer 141b is provided as needed. The second sublayer 141b may be omitted in some cases.

By providing the first sublayer 141a thus configured, the effect of suppressing hole overflow is obtained. This has the effect of improving optical output power during high current operation in the semiconductor light emitting device. Furthermore, the decrease of optical output power at increased operating temperature can be suppressed.

By providing the second sublayer 141b, the characteristics of the crystal surface can be improved, and the well layer 143 can be formed on the crystal surface with the improved characteristics. This particularly suppresses formation of non-radiative centers, and has the significant effect of increasing the light emission efficiency in the low current region during operation of the semiconductor light emitting device. Here, if the second sublayer 141b is doped with n-type impurity, non-radiative centers are screened, and the light emission efficiency in the low current region can be improved.

Alternatively, in the case where the second sublayer 141b is not provided, the well layer 143 can be made close to the AlGaN layer (first sublayer 141a) having a large band gap. Thus, the carrier concentration in the well layer 143 can be increased. Hence, the light emission efficiency can be increased. Furthermore, in particular, the decrease of light emission efficiency is limited even at large output power. This enables a semiconductor light emitting device operable with high light emission efficiency even in high current operation at high temperature.

The third sublayer 141c functions as a protective layer for covering the surface of the fourth layer 204 to grow a high quality first sublayer 141a. The third sublayer 141c is provided as needed. The third sublayer 141c may be omitted in some cases.

For example, the third sublayer 141c is grown at the same temperature, 850° C., as the third layer 203. Subsequently, the growth temperature is increased to 1040° C. to grow the first sublayer 141a. Then, the growth temperature is decreased to grow the second sublayer 141b and the well layer 143. This enables a semiconductor light emitting device with low hole overflow, high light emission efficiency in the well layer 143, and high optical output power from low current to high current.

Third Embodiment

Figure 4:
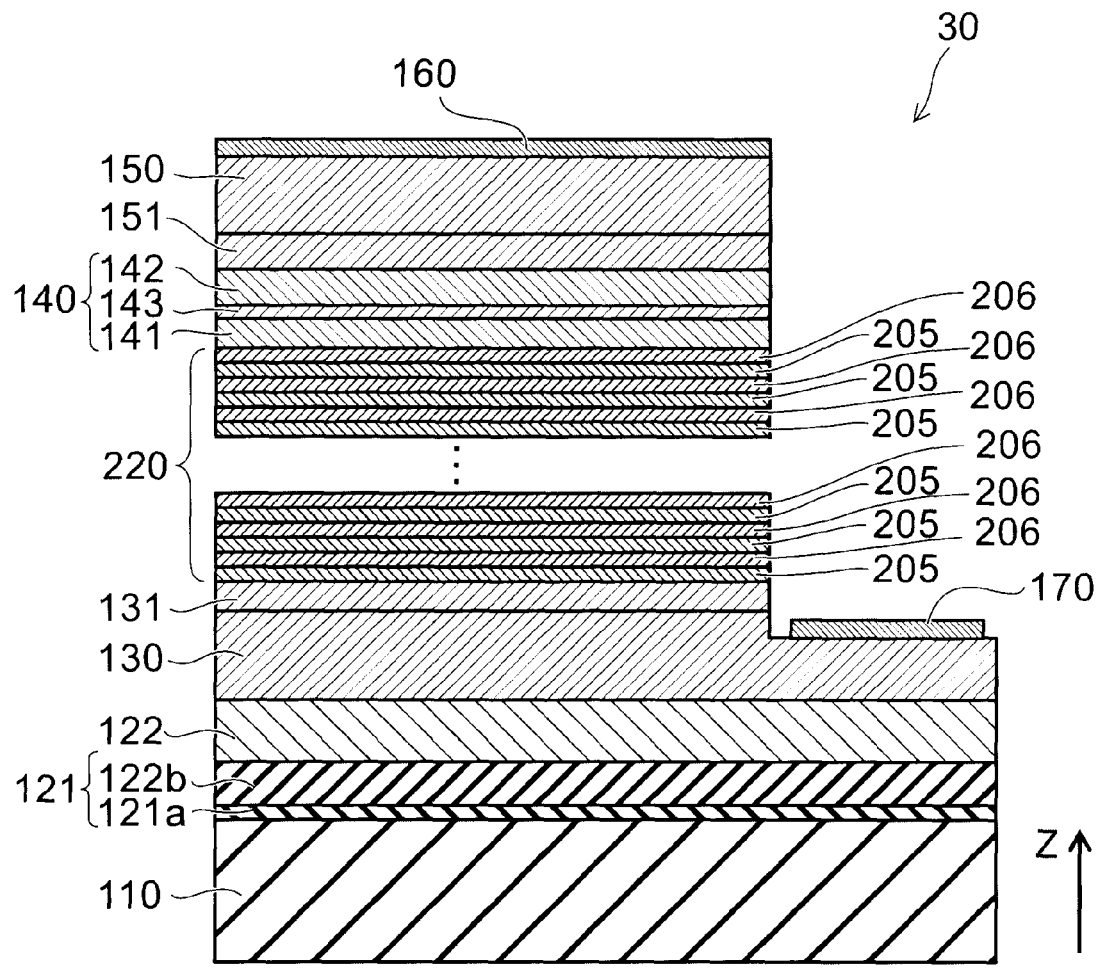
FIG. 4 is a schematic cross-sectional view illustrating the configuration of a semiconductor light emitting device according to a third embodiment.

FIG. 4 is a schematic cross-sectional view illustrating the configuration of a semiconductor light emitting device according to a third embodiment of the invention.

As shown in FIG. 4, in addition to the first layer 131, the second layer 151, and the light emitting portion 140, the semiconductor light emitting device 30 according to the third embodiment of the invention further includes a second stacked structural body 220 provided between the first layer 131 and the light emitting portion 140.

The second stacked structural body 220 includes a plurality of fifth layers 205 including GaN and a plurality of sixth layers 206 alternately stacked with the plurality of fifth layers 205 and including GaInN.

The plurality of fifth layers 205 and the plurality of sixth layers 206 are stacked along the Z-axis direction.

Each of the plurality of fifth layers 205 has a smaller thickness than the first barrier layer 141 and the second barrier layer 142. Each of the plurality of sixth layers 206 has a smaller thickness than the well layer 143.

The fifth layer 205 includes, for example, GaN doped with Si at, for example, approximately $5\times10^{18}$ cm$^{-3}$. The thickness of the fifth layer 205 is, for example, 2 nm.

The sixth layer 206 includes, for example, GaInN with an In composition ratio of 7%. That is, the sixth layer 206 has the same composition as the well layer 143. The thickness of the sixth layer 206 is set to, for example, 1 nm.

Here, 30 pairs of fifth layers 205 and sixth layers 206 are stacked.

The configuration other than the foregoing can be made similar to that of the semiconductor light emitting device 10, and hence the description thereof is omitted.

The inventors have found that the flatness of the crystal surface is enhanced by providing the second stacked structure 220 configured as described above.

This is presumably because GaN used for the fifth layer 205 is a binary compound, and has a significant effect of improving the lateral uniformity during growth of GaN.

Thus, by using the second stacked structure 220 capable of improving the flatness, the flatness of the light emitting portion 140 (particularly the well layer 143) is enhanced. Consequently, the crystal characteristics can be improved, and thereby the light emission efficiency can be increased. Furthermore, by enhancing the flatness, the flatness of the semiconductor layers other than the well layer 143 can be improved. This effect also serves to increase the light emission efficiency. Furthermore, because the semiconductor light emitting device 30 is also based on the SQW structure, the semiconductor light emitting device 30 can enjoy the effect described with reference to the first embodiment.

Thus, the semiconductor light emitting device 30 according to this embodiment also obtains a semiconductor light emitting device that emits near ultraviolet light with high efficiency.

Fourth Embodiment

Figure 5:
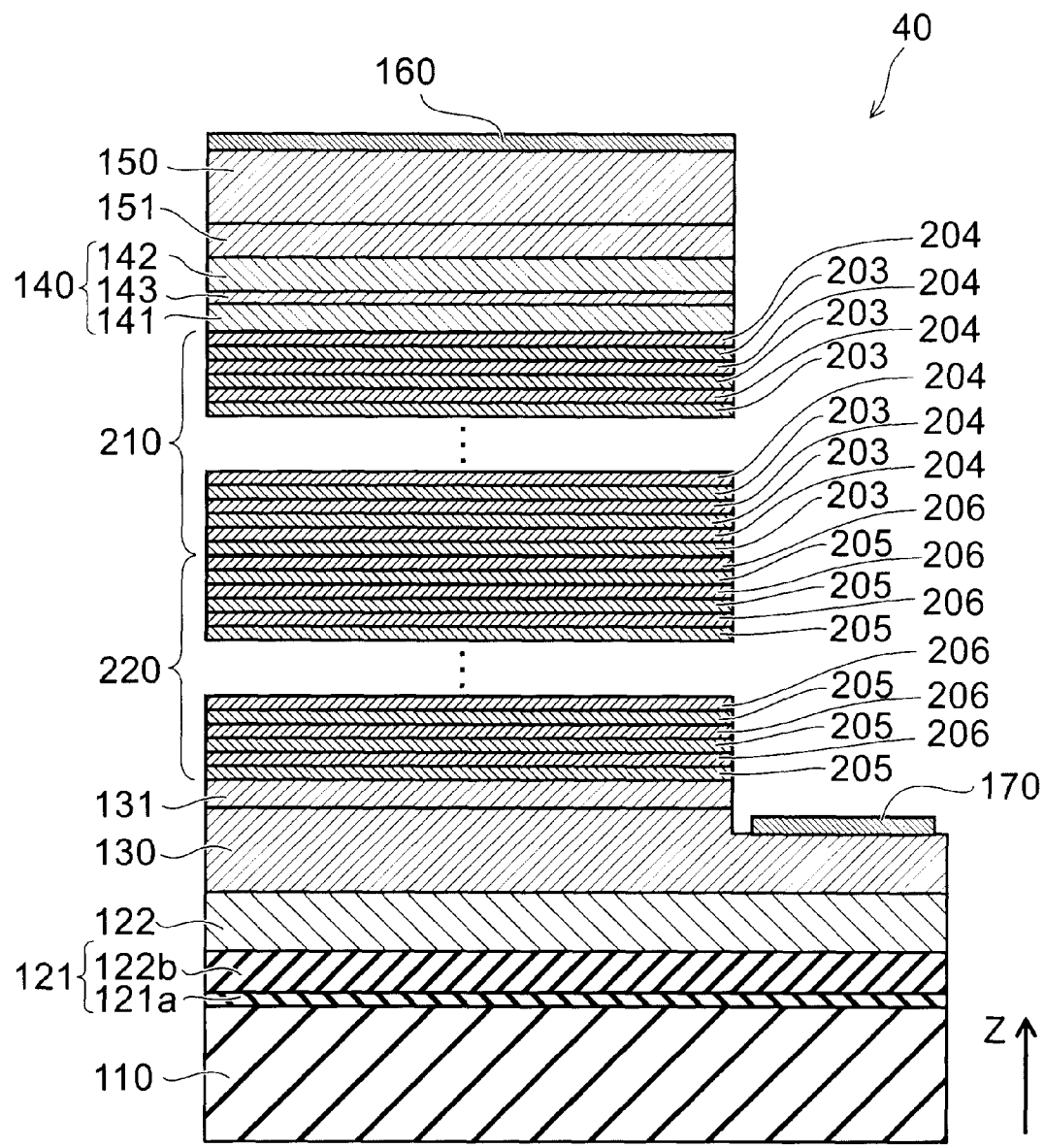
FIG. 5 is a schematic cross-sectional view illustrating the configuration of a semiconductor light emitting device according to a fourth embodiment.

FIG. 5 is a schematic cross-sectional view illustrating the configuration of a semiconductor light emitting device according to a fourth embodiment of the invention.

As shown in FIG. 5, in addition to the first layer 131, the second layer 151, and the light emitting portion 140, the semiconductor light emitting device 40 according to the fourth embodiment of the invention further includes a first stacked structural body 210 and a second stacked structural body 220 provided between the first layer 131 and the light emitting portion 140.

The first stacked structural body 210 and the second stacked structural body 220 can be those described with reference to the second and third embodiments, respectively.

This makes it possible to enjoy both the effects of enhancing the crystal quality achieved by the first stacked structural body 210 and enhancing the flatness achieved by the second stacked structural body 220. It is also possible to provide a plurality of first stacked structural bodies 210 and a plurality of second stacked structural bodies 220. In this case, the second stacked structural body 220 may be interposed between the plurality of first stacked structural bodies 210.

The second stacked structural body 220 may be provided between the first stacked structural body 210 and the light emitting portion 140, or between the first stacked structural body 210 and the first layer 131. In the following description, it is assumed that the second stacked structural body 220 is provided between the first stacked structural body 210 and the first layer 131.

That is, in the semiconductor light emitting device 40 according to this embodiment, the second stacked structural body 220 is provided between the first layer 131 (n-type confinement layer) and the first stacked structural body 210.

Also in the semiconductor light emitting device 40, the first barrier layer 141 includes $Al_{0.07}Ga_{0.925}In_{0.005}N$. The third layer 203 includes $Al_{0.07}Ga_{0.925}In_{0.005}N$. The thickness of the third layer 203 is 2 nm. Furthermore, the third layer 203 is doped with Si at, for example, approximately $5\times10^{18}$ cm$^{-3}$.

On the other hand, the well layer 143 includes $Ga_{0.93}In_{0.07}N$. The fourth layer 204 includes $Ga_{0.93}In_{0.07}N$. The thickness of the fourth layer 204 is 1 nm. The number of third layers 203 is 30, and the number of fourth layers 204 is 30. Here, the fourth layers 204 may be provided on both sides of the third layers 203 so that, for example, the number of third layers 203 is 30 whereas the number of fourth layers 204 is 31.

On the other hand, the fifth layer 205 of the second stacked structural body 220 includes GaN doped with Si at, for example, $1.2\times10^{18}$ cm$^{-3}$. The thickness of the fifth layer 205 is set to 2.5 nm.

The sixth layer 206 includes $Ga_{0.93}In_{0.07}N$. The thickness of the sixth layer 206 is set to 1 nm. The number of fifth layers 205 is 30, and the number of sixth layers 206 is 30. Here, the sixth layers 206 may be provided on both sides of the fifth layers 205 so that the number of fifth layers 205 is 30 whereas the number of sixth layers 206 is 31. In the case where the second stacked structural body 220 is grown at low temperature in conformity with the sixth layer 206, the initial layer grown at the decreased temperature is the sixth layer 206. Hence, by increasing the number of sixth layers 206, the growth can be started with a flatter layer. This enables growth of crystals with particularly high quality.

In the foregoing example, the number of pairs of third layers 203 and fourth layers 204 in the first stacked structural body 210 is equal to the number of pairs of fifth layers 205 and sixth layers 206 in the second stacked structural body 220. However, these numbers of pairs may be either equal or different, and suitably configured.

The semiconductor light emitting device 40 thus configured was actually fabricated, and its characteristics were evaluated. Then, ultraviolet light emission with high efficiency was confirmed.

Thus, it was found that the light emission efficiency is further increased by combined use of the second stacked structural body 220 having a significant effect of enhancing the flatness and the first stacked structural body 210 having a significant effect of enhancing the crystallinity.

More specifically, strain is introduced by the second stacked structural body 220 having a significant effect of enhancing the flatness. Thus, while maintaining the flatness of the crystal surface, the direction of dislocations in the crystal can be made close to a direction perpendicular to the crystal surface (a direction parallel to the stacking direction). Furthermore, by introducing the first stacked structural body 210, dislocations are made even closer to the direction perpendicular to the crystal surface. The reason for this is considered as follows. The lattice mismatch between the third layer 203 (AlGaN layer) and the fourth layer 204 (GaInN layer) in the first stacked structural body 210 is larger than the lattice mismatch between the fifth layer 205 (GaN layer) and the sixth layer 206 (GaInN layer) in the second stacked structural body 220. Hence, the first stacked structural body 210 has a larger force of bending dislocations than the second stacked structural body 220.

That is, the second stacked structural body 220 has a small lattice mismatch between layers and a small force of bending dislocations, but has high surface flatness. On the other hand, the first stacked structural body 210 has a large lattice mismatch between layers and a large force of bending dislocations. In this embodiment, by combining these second stacked structural body 220 and first stacked structural body 210, the direction of dislocations can be made close to the direction perpendicular to the crystal surface more effectively without decreasing the flatness of the crystal surface. This enables growth of crystals with higher quality.

Characteristics with higher efficiency can be obtained by fabricating the semiconductor light emitting device using the wafer having the stacked structural body of this embodiment.

In this embodiment, the third layer 203 can be made thinner than the fifth layer 205. For example, the thickness of the third layer 203 can be 2 nm, the thickness of the fourth layer 204 can be 1 nm, the thickness of the fifth layer 205 can be 2.5 nm, and the thickness of the sixth layer 206 can be 1 nm.

The reason why the third layer 203 is made thinner than the fifth layer 205 is as follows. To reduce absorption of light from the light emitting layer, the absorption wavelength in the first stacked structural body 210 and the second stacked structural body 220 is preferably made as short as possible. Because the third layer 203 includes Al, the third layer 203 has a larger band gap than the fifth layer 205 (GaN layer). Hence, to equalize the energy levels in the first stacked structural body 210 and the second stacked structural body 220, the third layer 203 is made thinner than the fifth layer 205. Thus, the average In composition ratio in the first stacked structural body 210 can be made higher. Hence, the crystal characteristics can be improved more efficiently with a small growth thickness.

In this embodiment, the fourth layer 204 can be made thicker than the fifth layer 205. Furthermore, the In composition ratio of the fourth layer 204 can be made higher than that of the fifth layer 205. The reason for this is as follows. To reduce absorption of light from the light emitting layer, the absorption wavelength in the first stacked structural body 210 and the second stacked structural body 220 is preferably made as short as possible. Because the third layer 203 includes Al, the third layer 203 has a larger band gap than the fifth layer 205 (GaN layer). Hence, to equalize the energy levels formed in the fourth layer 204 and the sixth layer 206, at least one of the following configurations is applied: increasing the thickness of the fourth layer 204, and increasing the In composition ratio in the fourth layer 204. Thus, the average In composition ratio in the first stacked structural body 210 can be made higher than in the second stacked structural body 220. Hence, the crystal characteristics can be improved more efficiently.

In this embodiment, with regard to the second stacked structural body 220, in the case of stacking 12 pairs of fifth layers 205 and sixth layers 206, significant irregularities were observed on the crystal surface. However, in the case of stacking 16 pairs, the flatness of the surface was improved. Furthermore, in the case of stacking 18, 20, and 27 pairs, semiconductor light emitting devices with high optical output power were obtained. Thus, the number of pairs of fifth layers 205 and sixth layers 206 is preferably not smaller than 16 and not larger than 27. However, in the case of stacking 27 pairs, the increase of defects in the crystal was also observed.

Hence, more preferably, the number of pairs of fifth layers 205 and sixth layers 206 is not smaller than 16 and not larger than 20.

In this embodiment, the Si concentration in the first barrier layer 141 is preferably as high as possible. This is for the purpose of introducing sufficient positive charge sources into the first barrier layer 141 by Si doping to suppress the influence of the electric field applied to the well layer 143 due to the effect of piezoelectric field. However, high Si concentration results in the degradation of the crystal quality. Hence, by increasing the Si concentration only in the thin first barrier layer 141, the effect of piezoelectric field can be suppressed while suppressing the characteristics degradation of the crystal.

To suppress the characteristics degradation of the crystal, in the first stacked structural body 210, the Si concentration is preferably lower than in the first barrier layer 141.

On the other hand, comparing between the energy band discontinuity of the heterostructure in the first stacked structural body 210 (AlGaInN layers and GaInN layers) and the energy band discontinuity of the heterostructure in the second stacked structural body 220 (GaN layers and GaInN layers), the energy band discontinuity in the first stacked structural body 210 is larger. Thus, to reduce the electrical resistance of the semiconductor light emitting device, the first stacked structural body 210 is preferably doped with Si at higher concentration than the second stacked structural body 220. However, if the Si concentration in the first stacked structural body 210 is too high, the crystal characteristics may be degraded. Hence, the second stacked structural body 220 is also doped with Si at an adequate concentration corresponding to the heterostructure of GaN layers and GaInN layers.

On the other hand, high Si concentration in the second barrier layer 142 may cause carrier overflow and internal absorption. Hence, the Si concentration in the second barrier layer 142 is preferably low.

Consequently, the Si concentration in the first barrier layer 141 is made higher than the Si concentration in the first stacked structural body 210. The Si concentration in the second stacked structural body 220 is made lower than the Si concentration in the first stacked structural body 210. The Si concentration in the second barrier layer 142 is made lower than the Si concentration in the second stacked structural body 220.

By adopting such Si concentration distribution, the crystal characteristics are enhanced, and the influence of the effect of piezoelectric field is suppressed. Hence, the light emission efficiency can be increased. Furthermore, the electrical resistance is low, and the influence of carrier overflow is insignificant. Hence, the light emission efficiency can be increased. Thus, the semiconductor light emitting device 40 according to this embodiment obtains a semiconductor light emitting device that emits near ultraviolet light with high efficiency.

Fifth Embodiment

Figure 6:
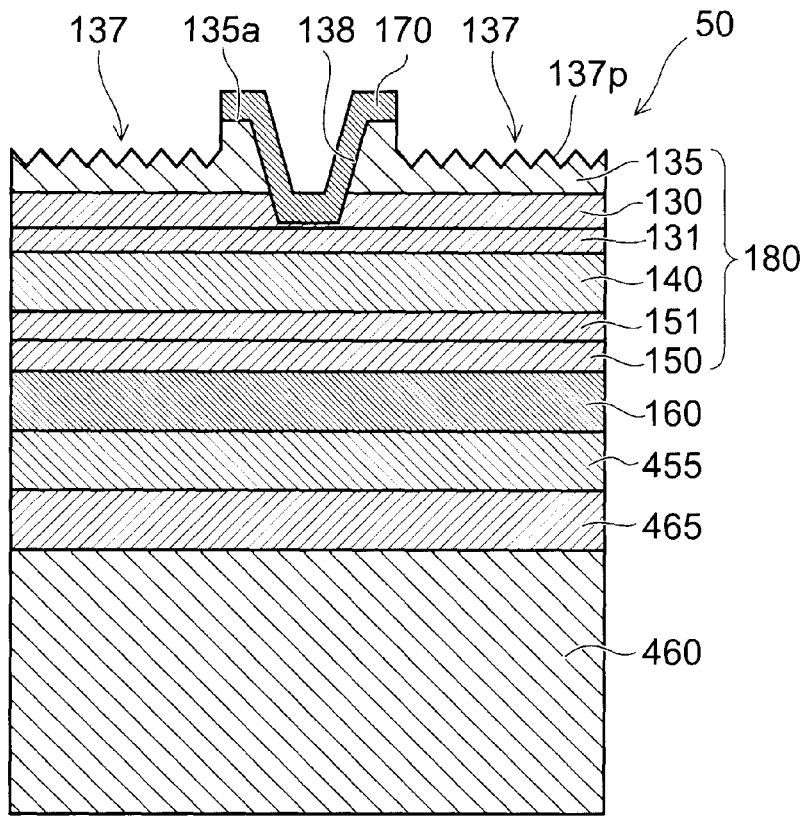
FIG. 6 is a schematic cross-sectional view illustrating the configuration of a semiconductor light emitting device according to a fifth embodiment.

FIG. 6 is a schematic cross-sectional view illustrating the configuration of a semiconductor light emitting device according to a fifth embodiment of the invention.

As shown in FIG. 6, the semiconductor light emitting device 50 according to the fifth embodiment of the invention includes a first layer 131, a light emitting portion 140, and a second layer 151 on a conductive substrate 460. The conductive substrate 460 is made of, for example, Ge.

Specifically, a p-type contact layer 150 is provided between the conductive substrate 460 and the second layer 151. A p-side electrode 160 is provided between the conductive substrate 460 and the p-type contact layer 150. The p-side electrode 160 is reflective to light emitted from the light emitting portion 140.

In this example, an adhesion metal layer 455 is provided between the conductive substrate 460 and the p-side electrode 160. A bonding metal layer 465 is provided between the conductive substrate 460 and the adhesion metal layer 455.

On the other hand, an n-type contact layer 130 is provided on the opposite side of the first layer 131 from the light emitting portion 140. A low impurity concentration semiconductor layer 135 is provided on the opposite side of the n-type contact layer 130 from the first layer 131.

The impurity concentration in the low impurity concentration semiconductor layer 135 is lower than the impurity concentration in the n-type contact layer 130. The low impurity concentration semiconductor layer 135 is, for example, a non-doped GaN layer. The low impurity concentration semiconductor layer 135 can be the second buffer layer 122 (lattice relaxation layer) described above.

The low impurity concentration semiconductor layer 135 may have a two-layer structure. More specifically, an n-type low impurity concentration layer (not shown) may be provided between the second buffer layer 122 and the n-type contact layer 130 so that the second buffer layer 122 and this n-type low impurity concentration layer constitute the low impurity concentration semiconductor layer 135. In such configuration, the aforementioned n-type low impurity concentration layer has low n-type impurity concentration. Hence, the n-type low impurity concentration layer is readily grown with high crystal quality on the second buffer layer 122, and then the n-type contact layer 130 can be grown thereon. Here, the n-type contact layer 130 has high impurity concentration, and its crystal growth is difficult. However, in this configuration, the n-type contact layer 130 can be grown on the high quality foundation crystal. Thus, a high quality n-type contact layer 130 can be grown.

An opening 138 is provided in the low impurity concentration semiconductor layer 135. The opening 138 exposes part of the n-type contact layer 130. The opening 138 communicates with the n-type contact layer 130 from the major surface 135a of the low impurity concentration semiconductor layer 135 on the opposite side from the n-type contact layer 130. That is, the bottom of the opening 138 communicates with the n-type contact layer 130.

An n-side electrode 170 is provided so as to cover the n-type contact layer 130 exposed in the opening 138 and part of the low impurity concentration semiconductor layer 135.

A rough surface portion 137 having a corrugation 137p is provided on the major surface 135a of the portion of the low impurity concentration semiconductor layer 135 not covered with the n-side electrode 170.

Although omitted in FIG. 6, at least one of the first stacked structural body 210 and the second stacked structural body 220 described above may be provided. In the following description, it is assumed that the first stacked structural body 210 and the second stacked structural body 220 are provided.

The semiconductor light emitting device 50 is fabricated by, for example, the following method.

For example, on a substrate 110 made of sapphire, crystal layers of a first buffer layer 121, a second buffer layer 122 (constituting the low impurity concentration semiconductor layer 135), an n-type contact layer 130, a first layer 131 (n-type confinement layer), a first stacked structural body 210, a second stacked structure 220, a light emitting portion 140, a second layer 151 (p-type confinement layer), and a p-type contact layer 150 are formed to form a crystal stacked body 180.

Then, the following processes are performed: forming a p-side electrode 160 on the crystal stacked body 180; bonding the crystal stacked body 180 to a conductive substrate 460; removing the substrate 110 and the first buffer layer 121; and forming an n-side electrode 170 on the exposed crystal layer (n-type contact layer 130) and forming a rough surface portion 137 (i.e., corrugation 137p) on the low impurity concentration semiconductor layer 135.

First, an example of the crystal layers on the substrate 110 made of sapphire will be described.

For example, by metal organic chemical vapor deposition, a first buffer layer 121 including AlN is formed with a thickness of, for example, 2 μm on the substrate 110 having a surface made a sapphire c-plane. Then, as a second buffer layer 122, a non-doped GaN layer is formed thereon with a thickness of, for example, 2 μm.

Here, the first buffer layer 121 can include AlN as described above. However, this embodiment is not limited thereto. For example, the first buffer layer 121 may include $Al_{\alpha 2}Ga_{1-\alpha 2}N$ ($0.8 \leq \alpha 2 \leq 1$). In this case, the wafer warpage can be compensated by adjusting the Al composition ratio.

Then, as an n-type contact layer 130, a Si-doped n-type GaN layer (the Si concentration is, for example, not lower than $1 \times 10^{18}$ cm$^{-3}$ and not higher than $1 \times 10^{20}$ cm$^{-3}$) is formed with a thickness of, for example, 6 μm. Then, as a first layer 131, a Si-doped n-type GaN layer is formed thereon with a thickness of, for example, 0.5 μm.

Subsequently, the second stacked structural body 220 and the first stacked structural body 210 described above are formed. Then, as a first barrier layer 141, a Si-doped n-type $Al_{0.07}Ga_{0.925}In_{0.005}N$ layer (the Si concentration is, for example, not lower than $1.0 \times 10^{19}$ cm$^{-3}$ and not higher than $1.5 \times 10^{19}$ cm$^{-3}$) is formed. Then, as a well layer 143, a GaInN layer (the wavelength is not shorter than 380 nm and not longer than 400 nm) is formed thereon. Then, as a second barrier layer 142, an $Al_{0.07}Ga_{0.925}In_{0.005}N$ layer (the Si concentration is, for example, $1.0 \times 10^{18}$ cm$^{-3}$ or lower, and specifically, Si doping may be omitted) is formed thereon.

Furthermore, as a second layer 151, a Mg-doped p-type $Al_{0.22}Ga_{0.78}N$ layer (the Mg concentration is, for example, $1 \times 10^{19}$ cm$^{-3}$) is formed with a thickness of 0.02 μm. Then, as a p-type contact layer 150, a Mg-doped p-type GaN layer is formed with a thickness of 0.28 μm.

By setting the Mg concentration of the p-type contact layer 150 to as relatively high as $1 \times 10^{20}$ cm$^{-3}$ or higher and lower than $1 \times 10^{21}$ cm$^{-3}$, the ohmic contact with the p-side electrode 160 can be improved. However, in the case of semiconductor light emitting diodes, in contrast to semiconductor laser diodes, the distance between the contact layer and the light emitting layer is short. Hence, there is concern about characteristics degradation due to Mg diffusion. Here, the contact surface area between the p-side electrode 160 and the p-type contact layer 150 is large. This results in low current density during operation. Exploiting this fact, the Mg concentration in the p-type contact layer 150 can be reduced to approximately $1 \times 10^{19}$ cm$^{-3}$ or higher and lower than $1 \times 10^{20}$ cm$^{-3}$ without significantly impairing the electrical characteristics. Thus, Mg diffusion can be prevented, and the light emission characteristics can be improved.

Next, formation of a p-side electrode 160 on the crystal stacked body 180, bonding of the crystal stacked body 180 to a conductive substrate 460, and removal of the substrate 110 and the first buffer layer 121 will be described.

First, to form a p-side electrode 160, a vacuum evaporation apparatus is used for continuous formation of, for example, Ag with a thickness of 200 nm and Pt with a thickness of 2 nm.

After lift-off, sintering treatment is performed in an oxygen atmosphere at 400° C. for 1 min (minute).

Then, as an adhesion metal layer 455, for example, a stacked film of Ni film and Au film is formed with a thickness of 1000 nm on the p-side electrode 160.

Then, a bonding metal layer 465 (e.g., AuSn solder with a film thickness of 3 μm) formed on the conductive substrate 460 made of, for example, Ge is opposed to the adhesion metal layer 455 formed on the crystal stacked body 180. By heating to a temperature equal to or higher than the eutectic point of AuSn, for example, 300° C., the conductive substrate 460 is bonded to the crystal stacked body 180.

Then, from the side of the substrate 110 made of sapphire, for example, the third harmonic (355 nm) or fourth harmonic (266 nm) laser light of a YVO$_4$ solid-state laser is applied. The laser light has a wavelength shorter than the forbidden band wavelength corresponding to the forbidden band width of GaN in the second buffer layer 122 (GaN layer, e.g., the aforementioned non-doped GaN buffer layer). That is, the laser light has energy higher than the forbidden band width of GaN.

This laser light is efficiently absorbed in a region of the second buffer layer 122 (non-doped GaN buffer layer) on the first buffer layer 121 (single crystal AlN buffer layer) side. Thus, GaN in the second buffer layer 122 (GaN buffer layer) on the first buffer layer 121 (single crystal AlN buffer layer) side is decomposed by generated heat.

Here, the first buffer layer 121 can include AlN as described above. However, this embodiment is not limited thereto. For example, the first buffer layer 121 may include $Al_{\alpha 2}Ga_{1-\alpha 2}N$ ($0.8 \leq \alpha 2 \leq 1$). In this case, the wafer warpage can be compensated by adjusting the Al composition ratio.

In such a laser lift-off method, the temperature of GaN rapidly increases. Thus, rapid thermal expansion and thermal contraction occur. In the case where the first buffer layer 121 is made of AlN, heat rapidly spreads because of its high thermal conductivity. This can relax the influence of local thermal expansion and contraction.

On the other hand, in the case where the first buffer layer 121 is made of AlGaN, only a slight addition of Ga sharply decreases the thermal conductivity. This can suppress the spread of the influence of temperature change by laser light, and is suitable to locally and rapidly change the temperature. Thus, the output power of laser light can be decreased. This can suppress damage by laser light spreading over the wafer.

Then, the decomposed GaN is removed by hydrochloric acid treatment, or the like. Thus, the substrate 110 made of sapphire is stripped and separated from the crystal stacked body 180.

Next, formation of an n-side electrode 170 on the exposed crystal layer (n-type contact layer 130) and formation of a corrugation 137p on the low impurity concentration semiconductor layer 135 will be described.

An opening 138 is formed by removing part of the second buffer layer 122 (non-doped GaN layer) stripped from the substrate 110 made of sapphire. This opening 138 exposes part of the n-type contact layer 130 (n-type GaN layer, i.e., the aforementioned Si-doped n-type GaN layer). Here, to prevent step disconnection of the n-side electrode 170, the side surface of the opening 138 is preferably processed into a tapered shape. For example, a recess tapered at 50° can be formed as an opening 138 by dry etching with chlorine gas using a resist mask. A Ti/Pt/Au stacked film, for example, is formed with a thickness of, for example, 500 nm by a lift-off method, or the like, so as to cover the n-type contact layer 130 (Si-doped n-type GaN layer) exposed in the opening 138 and part of the second buffer layer 122 (non-doped GaN layer). The stacked film is patterned into an n-side electrode 170.

Subsequently, the surface of the second buffer layer 122 (non-doped GaN layer) outside the n-side electrode 170 is processed by, for example, alkaline etching with KOH solution to form a corrugation 137p. The processing with KOH solution is performed under the following condition, for example: 1 mol/L of KOH solution is heated to 80° C., and etching is performed for 20 min. Thus, the corrugation 137p is formed.

Next, by cleavage, diamond blade cutting, or the like, the conductive substrate 460 is cut into individual devices. Thus, the semiconductor light emitting device 50 according to this embodiment is fabricated.

In the foregoing, the size of the corrugation 137p is made larger than, for example, the wavelength of emission light emitted from the light emitting portion 140. Specifically, the size of the corrugation 137p is made larger than, for example, the wavelength in the low impurity concentration semiconductor layer 135 of emission light emitted from the light emitting portion 140. Hence, the optical path is varied in the rough surface portion 137 provided with the corrugation 137p, and the light extraction efficiency is increased. Thus, a semiconductor light emitting device with higher efficiency is obtained.

Thus, in the semiconductor light emitting device 50 according to this embodiment, a GaN layer is grown via a single crystal buffer layer including $Al_{x3}Ga_{1-x3}N$ ($0.8 \leq x3 \leq 1$) on the substrate 110 whose major surface is a c-plane of a sapphire layer. The first layer 131 is provided on the GaN layer. Namely, the semiconductor light emitting device 50 further includes: a substrate 110, a major surface of the substrate 110 being a c-plane of a sapphire layer; a single crystal buffer layer provided between the substrate 110 and the first layer 131, the single crystal buffer layer including $Al_{x3}Ga_{1-x3}N$ ($0.8 \leq x3 \leq 1$); and a GaN layer provided between the single crystal buffer layer and the first layer 131.

This single crystal buffer layer includes, for example, the first buffer layer 121. That is, this single crystal buffer layer includes, for example, a high carbon concentration first AlN buffer layer 121a and a high purity second AlN buffer layer 121b formed on the first AlN buffer layer 121a.

Furthermore, the aforementioned GaN layer grown via the single crystal buffer layer includes, for example, the second buffer layer 122, the n-type contact layer 130, the Si-doped n-type confinement layer, and the like.

Thus, a GaN layer with high crystal quality is obtained by growing a GaN layer on the substrate 110 via the aforementioned single crystal buffer layer.

The conductive substrate 460 can be made of a material at least being conductive. Although it is not particularly limited, a semiconductor substrate of Si, Ge, and the like and a metal plate of Cu, CuW, and the like, for example, are used. Furthermore, the conductive substrate 460 does not need to be entirely conductive. The conductive substrate 460 only needs to be conductive in at least a portion thereof. For example, a plate, or the like in which metal wirings are provided in resin can be used.

The p-side electrode 160 includes at least silver or an alloy thereof. The reflection efficiency of a single layer film of metal other than silver with respect to the visible light band region tends to decrease as the wavelength gets shorter in the ultraviolet band region of 420 nm or shorter. However, silver has high reflection efficiency characteristics also for light of the ultraviolet band region of not shorter than 370 nm and not longer than 410 nm. Hence, in the case where the p-side electrode 160 of semiconductor light emitting devices for ultraviolet emission is made of a silver alloy, it is preferable that a portion of the p-side electrode 160 on the side of the interface with the semiconductor layer has a higher component ratio of silver. The thickness of the p-side electrode 160 is preferably 100 nm or larger to ensure the light reflection efficiency.

To prevent solder from diffusing into or reacting with the p-side electrode 160, a diffusion prevention layer may be provided on the p-side electrode 160. The diffusion prevention layer has the property of not reacting with silver, or not actively diffusing into silver. This diffusion prevention layer is in electrical contact with the p-side electrode 160. This diffusion prevention layer can be made of a single layer film or a stacked film of high melting point metal such as vanadium (V), chromium (Cr), iron (Fe), cobalt (Co), nickel (Ni), niobium (Nb), molybdenum (Mo), ruthenium (Ru), rhodium (Rh), tantalum (Ta), tungsten (W), rhenium (Re), iridium (Ir), and platinum (Pt).

More preferably, the metal constituting the diffusion prevention layer has high work function so that some diffusion causes no problem, and the metal is likely to form ohmic contact with the p-type contact layer 150 (p-type GaN layer). This metal includes at least one of iron (Fe), cobalt (Co), nickel (Ni), rhodium (Rh), tungsten (W), rhenium (Re), iridium (Ir), and platinum (Pt).

In the case of a single layer film, the thickness of the diffusion prevention layer is preferably in the range of not smaller than 5 nm and not larger than 200 nm so that the film state can be maintained. In the case of a stacked film, the thickness of the diffusion prevention layer is not particularly limited, but can be set to a value in the range of, for example, not smaller than 10 nm and not larger than 10000 nm.

In the semiconductor light emitting device 50 according to this embodiment, a GaN layer is formed on the substrate 110 made of sapphire. The first layer 131 is formed on the GaN layer. The light emitting portion 140 is formed on the first layer 131. The second layer 151 is formed on the light emitting portion 140. Then, the substrate 110 is removed. Namely, the first layer 131 is provided between the light emitting portion 140 and a GaN layer formed on a substrate 110 made of sapphire. And the substrate 120 is removed. In the semiconductor light emitting device 50 thus configured, a particularly high light emission efficiency can be achieved.

More specifically, in the semiconductor light emitting device 50 having a thin film structure from which the substrate 110 is removed, the average length of optical path where light is extracted outside is long. Hence, reducing absorption inside the device (semiconductor layers) is very effective in increasing the light extraction efficiency. Thus, the effect of this embodiment for suppressing optical absorption inside the device (inside the semiconductor layers) by using a single quantum well structure for the light emitting portion 140 is achieved particularly significantly in the configuration obtained by removing the substrate 110.

When the crystal stacked body 180 is bonded to the conductive substrate 460 and when the GaN layer is decomposed by laser light to strip the substrate 110 made of sapphire, the crystal layers of the crystal stacked body 180 are susceptible to crystal defects and damage.

This is presumably caused by the thermal expansion coefficient difference between the conductive substrate 460, sapphire, and the GaN layer, local heating, products generated by decomposition of GaN, and the like. If crystal defects and damage occur in the crystal layer, Ag contained in the p-side electrode 160 diffuses through the crystal defects and damage. This results in accelerated increase of leaks and crystal defects inside the crystal.

According to this embodiment, the well layer 143 is a single layer. Hence, the characteristics of the crystal (well layer 143) can be significantly improved by the strain applied by the stacked structure from the substrate 110 side. Furthermore, because of the single layer, the well layer 143 is free from the problem which may occur in the MQW structure (in a plurality of well layers, the improvement of crystal quality is insufficient on the growth substrate side, and the strain excessively increases on the side opposite to the growth substrate, causing the problem of characteristics degradation in the crystal). Thus, the crystal quality of the well layer 143 can be maximized.

This effect is achieved particularly effectively in the case where the crystal is subjected to loads by removal of the substrate 110 as in this embodiment. That is, the crystal can achieve high quality also after the substrate 110 used for crystal growth is removed.

As in this embodiment, in the structure obtained by removing the substrate 110 to extract light using reflection at the electrode (p-side electrode 160) made of a high reflectance metal, there is no optical loss at the interface between the substrate 110 and the growth crystal and inside the substrate 110. Hence, this embodiment has a significant effect of improving the light emission efficiency by reducing optical loss in the crystal.

That is, in this embodiment, the SQW structure is adopted. Thus, light emitted from the well layer 143 having high light emission efficiency is not absorbed by other well layers having low efficiency. Because there is no problem of such absorption, light can be extracted outside with very high efficiency.

In particular, in this embodiment, the crystal quality is significantly enhanced by introducing the first stacked structural body 210 and the second stacked structural body 220. Hence, this embodiment effectively suppresses the characteristics degradation of the well layer 143 which may occur in removing the substrate 110.

In the semiconductor light emitting device having the structure obtained by removing the substrate 110, the decrease of light emission efficiency is likely to occur. The inventors analyzed the cause of being prone to the decrease of light emission efficiency in this configuration. As a result, the inventors have inferred that the increase of dislocations in the crystal due to high strain applied from the substrate 110 side in the process of removing the substrate 110 significantly contributes to the decrease of light emission efficiency.

More specifically, in removing the substrate 110, if the substrate 110 is removed by heating, it is considered that dislocations having lateral components associated with thermal expansion are introduced into the crystal. Furthermore, when the substrate 110 is stripped, the stripped portion and the non-stripped portion are produced. Hence, the stripping proceeds with a force applied obliquely. Thus, it is inferred that dislocations associated with the removal of the substrate 110 also have oblique components.

In the semiconductor light emitting device 50 according to this embodiment, the first stacked structural body 210 and the second stacked structural body 220 are introduced between the substrate 110 and the light emitting portion 140. It is considered that they affect the change of the direction of dislocations (the change to the lateral and oblique direction) associated with the removal of the substrate 110. That is, it is presumed that because the direction of dislocations is made close to the direction perpendicular to the crystal surface in this embodiment, the effect of suppressing the change of the direction of dislocations is achieved. This suppresses the decrease of light emission efficiency, which may occur in removing the substrate 110, and enables a semiconductor light emitting device for emitting light with high efficiency.

In this embodiment, both the first stacked structural body 210 and the second stacked structural body 220 are used. Hence, the aforementioned effect is particularly significant. However, even in the case of using one of them, the effect of increasing the light emission efficiency is achieved. In particular, if the first stacked structural body 210 is used, the lattice mismatch between the third layer 203 and the fourth layer 204 is large, and the effect of changing the direction of dislocations is significant. Furthermore, even in the case where the crystal is nonuniform in the plane, the effect of changing the direction of dislocations is significant, and the contribution to the efficiency increase of the semiconductor light emitting device is significant.

As described above, the configuration according to the embodiment of the invention can be applied to the semiconductor light emitting device based on the configuration obtained by removing the substrate 110. Then, because of the high crystal quality, the characteristics degradation of the crystal associated with the removal of the substrate 110 is suppressed. Thus, light emission with particularly high efficiency can be realized. That is, the light emission efficiency can be increased particularly effectively by combined use of the configuration obtained by removing the substrate 110, the light emitting portion 140 of the SQW structure, and the first stacked structural body 210. Moreover, the light emission efficiency can be increased more effectively by further combination with the second stacked structural body 220.

Sixth Embodiment

Figure 7:
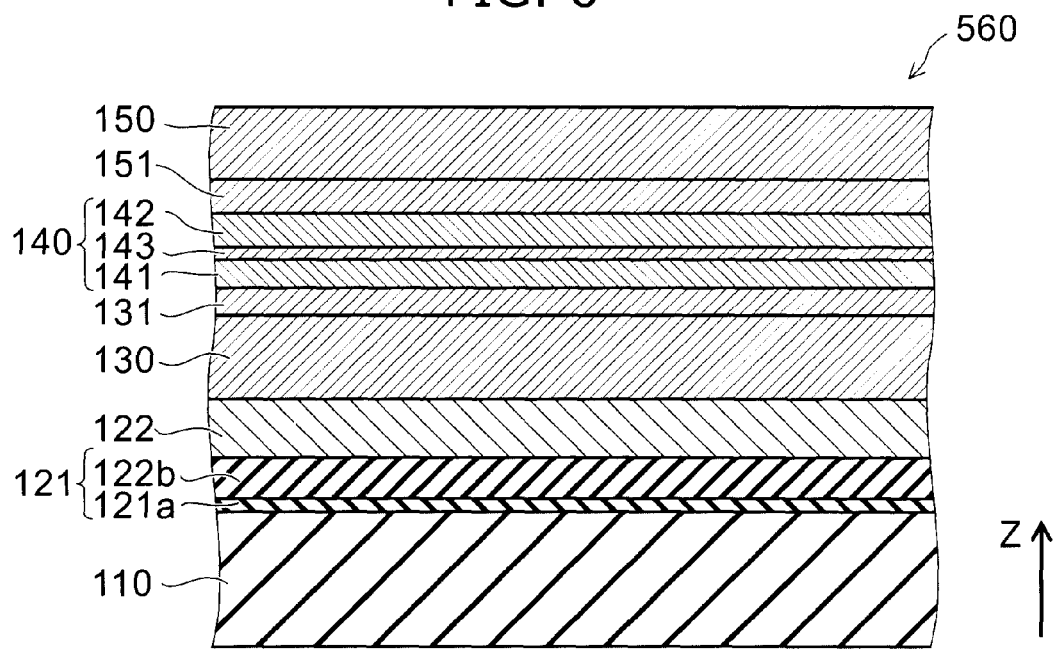
FIG. 7 is a schematic cross-sectional view illustrating the configuration of a wafer according to a sixth embodiment.

FIG. 7 is a schematic cross-sectional view illustrating the configuration of a wafer according to a sixth embodiment of the invention.

As shown in FIG. 7, the wafer 560 according to this embodiment includes a first layer 131 including at least one of n-type GaN and n-type AlGaN, a second layer 151 including p-type AlGaN, and a light emitting portion 140. The light emitting portion 140 has a single quantum well structure made of a first barrier layer 141, a second barrier layer 142, and a well layer 143. The first barrier layer 141 is provided between the first layer 131 and the second layer 151 and includes $Al_{x1}Ga_{1-x1-y1}In_{y1}N$ (0<x1, 0≤y1, x1+y1<1). The second barrier layer 142 is provided between the first barrier layer 141 and the second layer 151 and includes $Al_{x2}Ga_{1-x2-y2}In_{y2}N$ (0<x2, 0≤y2, x2+y2<1). The well layer 143 is provided between the first barrier layer 141 and the second barrier layer 142 and includes $Al_{x0}Ga_{1-x0-y0}In_{y0}N$ (0≤x0, 0<y0, x0+y0<1, y1<y0, y2<y0).

The well layer 143 has a thickness of not smaller than 4.5 nm and not larger than 9 nm. The well layer 143 emits near ultraviolet light. The peak wavelength of the well layer 143 is, for example, not shorter than 380 nm and not longer than 400 nm.

The wafer 560 thus configured can achieve an effect similar to that of the aforementioned semiconductor light emitting device according to the embodiments of the invention. The wafer 560 can provide a wafer that emits near ultraviolet light with high efficiency.

As shown in FIG. 7, the wafer 560 can further include various layers described with reference to the aforementioned semiconductor light emitting device according to the embodiments of the invention.

In the wafer 560, the thickness of the well layer 143 is preferably set to not smaller than 5 nm and not larger than 7 nm in particular.

Figure 8:
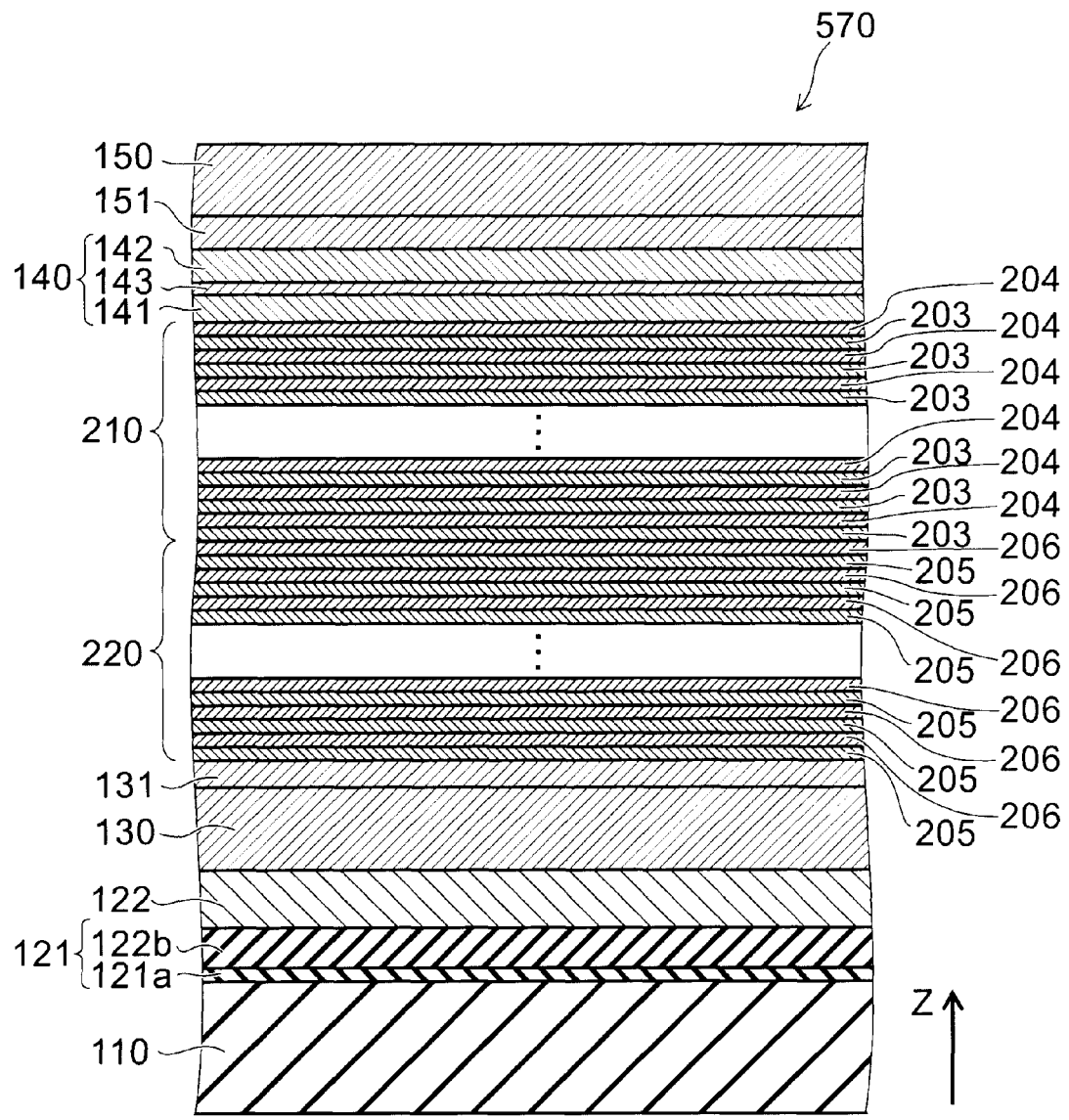
FIG. 8 is a schematic cross-sectional view illustrating the configuration of another wafer according to the sixth embodiment.

FIG. 8 is a schematic cross-sectional view illustrating the configuration of one other wafer according to the sixth embodiment of the invention.

As shown in FIG. 8, the wafer 570 according to this embodiment further includes a first stacked structural body 210 provided between the first layer 131 and the light emitting portion 140. The first stacked structural body 210 includes a plurality of third layers 203 including AlGaInN and a plurality of fourth layers 204 alternately stacked with the plurality of third layers 203 and including GaInN. Each of the plurality of third layers 203 has a smaller thickness than the first barrier layer 141 and the second barrier layer 142. Each of the plurality of fourth layers 204 has a smaller thickness than the well layer 143.

Moreover, the wafer 570 further includes a second stacked structural body 220 provided between the first layer 131 and the light emitting portion 140. The second stacked structure 220 includes a plurality of fifth layers 205 including GaN and a plurality of sixth layers 206 alternately stacked with the plurality of fifth layers 205 and including GaInN. Each of the plurality of fifth layers 205 has a smaller thickness than the first barrier layer 141 and the second barrier layer 142. Each of the plurality of sixth layers 206 has a smaller thickness than the well layer 143.

As described above with reference to the semiconductor light emitting device according to the embodiments of the invention, at least one of the first stacked structural body 210 and the second stacked structural body 220 may be provided. Furthermore, the second stacked structural body 220 can be provided between the first layer 131 and the first stacked structural body 210.

The sum of the total thickness of the plurality of fourth layers 204 and the thickness of the well layer 143 can be not smaller than 25 nm and not larger than 45 nm.

The effect of increasing the light emission efficiency in the wafer 570 is as described with reference to the semiconductor light emitting device according to the embodiments.

Seventh Embodiment

A method for manufacturing a semiconductor light emitting device according to this embodiment is, for example, the method for manufacturing the semiconductor light emitting device 50 described with reference to the fifth embodiment.

Figure 9:
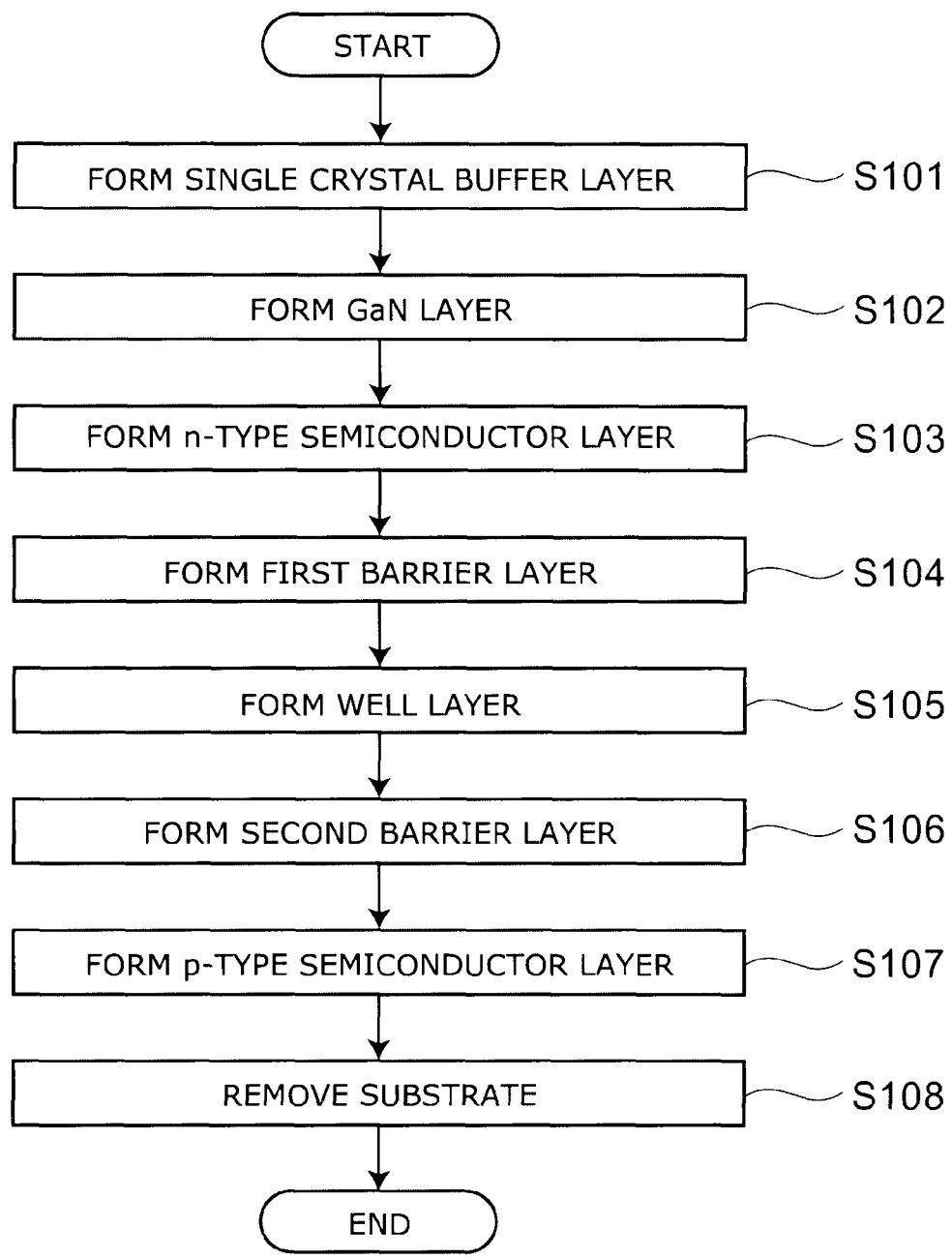
FIG. 9 is a flowchart illustrating a method for manufacturing a semiconductor light emitting device according to a seventh embodiment.

FIG. 9 is a flow chart illustrating a method for manufacturing a semiconductor light emitting device according to a seventh embodiment of the invention.

As shown in FIG. 9, in the method for manufacturing a semiconductor light emitting device according to this embodiment, a single crystal buffer layer including $Al_{x3}Ga_{1-x3}N$ ($0.8 \leq x3 \leq 1$) is formed on a substrate 110 whose major surface is a c-plane of a sapphire layer (step S101). For example, a high carbon concentration first AlN buffer layer 121a, and a high purity second AlN buffer layer 121b formed on the first AlN buffer layer 121a, are sequentially formed.

Then, a GaN layer is formed on the single crystal buffer layer (step S102). For example, the second buffer layer 122, the n-type contact layer 130, and the like are formed.

Then, on the GaN layer, an n-type semiconductor layer including a first layer 131 including at least one of n-type GaN and n-type AlGaN is formed (step S103).

Then, on the n-type semiconductor layer, a first barrier layer 141 including $Al_{x1}Ga_{1-x1-y1}In_{y1}N$ ($0<x1$, $0 \leq y1$, $x1+y1<1$) is formed (step S104).

Then, on the first barrier layer 141, a well layer 143 including $Al_{x0}Ga_{1-x0-y0}In_{y0}N$ ($0 \leq x0$, $0<y0$, $x0+y0<1$, $y1<y0$, $y2<y0$) is formed (step S105). The thickness of the well layer 143 is set to not smaller than 4.5 nm and not larger than 9 nm. The well layer 143 emits near ultraviolet light. The peak wavelength of the well layer 143 is, for example, not shorter than 380 nm and not longer than 400 nm.

Then, on the well layer 143, a second barrier layer 142 including $Al_{x2}Ga_{1-x2-y2}In_{y2}N$ ($0<x2$, $0 \leq y2$, $x2+y2<1$) is formed (step S106).

Then, on the second barrier layer 142, a p-type semiconductor layer including a second layer 151 including p-type AlGaN is formed (step S107).

Then, after forming the p-type semiconductor layer, the substrate 110 is removed (step S108).

In the method for manufacturing a semiconductor light emitting device according to this embodiment, the process of removing the substrate 110 is combined with the light emitting portion 140 of the SQW structure. Thus, the light emission efficiency can be increased particularly effectively. Moreover, the light emission efficiency can be increased more effectively by further combination with at least one of the first stacked structural body 210 and the second stacked structural body 220.

Eighth Embodiment

Figure 10:
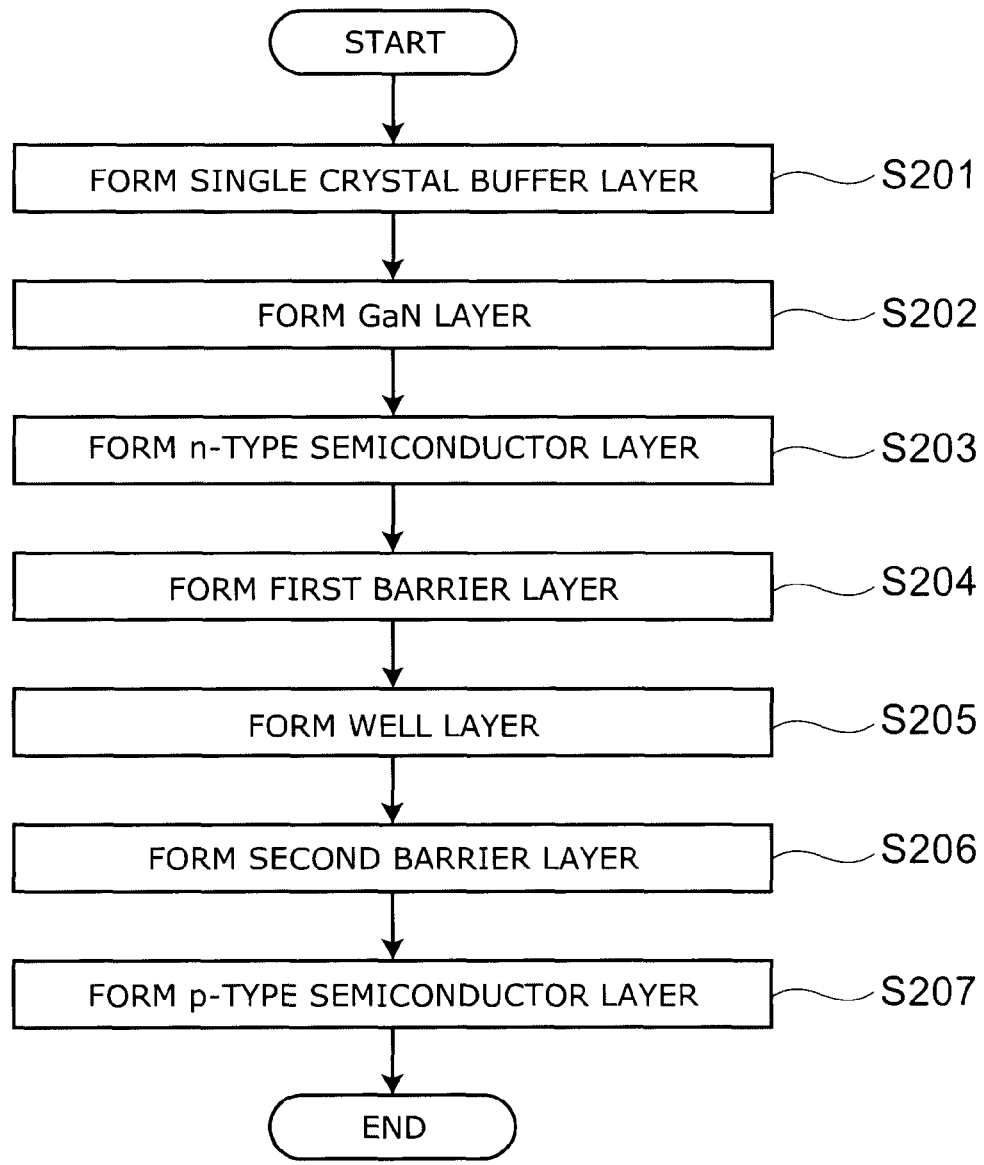
FIG. 10 is a flowchart illustrating a method for manufacturing a semiconductor light emitting device according to an eight embodiment.

FIG. 10 is a flow chart illustrating a method for manufacturing a semiconductor light emitting device according to an eighth embodiment of the invention.

As shown in FIG. 10, in the method for manufacturing a semiconductor light emitting device according to this embodiment, by metal organic chemical vapor deposition, an AlN layer (first buffer layer 121) is formed on a substrate 110 made of sapphire (step S201). For example, a high carbon concentration first AlN buffer layer 121a, and a high purity second AlN buffer layer 121b formed on the first AlN buffer layer 121a, are sequentially formed.

Then, on this AlN layer, a GaN layer is formed by metal organic chemical vapor deposition (step S202). For example, the second buffer layer 122, the n-type contact layer 130, and the like are formed.

Then, on this GaN layer, an n-type semiconductor layer including a first layer 131 including at least one of n-type GaN and n-type AlGaN is formed by metal organic chemical vapor deposition (step S203).

Then, on the n-type semiconductor layer, a first barrier layer 141 including $Al_{x1}Ga_{1-x1-y1}In_{y1}N$ ($0<x1$, $0 \leq y1$, $x1+y1<1$) is formed by metal organic chemical vapor deposition (step S204).

Then, on the first barrier layer 141, a well layer 143 including $Al_{x0}Ga_{1-x0-y0}In_{y0}N$ ($0 \leq x0$, $0<y0$, $x0+y0<1$, $y1<y0$, $y2<y0$) is formed by metal organic chemical vapor deposition (step S205). The thickness of the well layer 143 is set to not smaller than 4.5 nm and not larger than 9 nm. The well layer 143 emits near ultraviolet light. The peak wavelength of the well layer 143 is, for example, not shorter than 380 nm and not longer than 400 nm.

Then, on the well layer 143, a second barrier layer 142 including $Al_{x2}Ga_{1-x2-y2}In_{y2}N$ ($0<x2$, $0 \leq y2$, $x2+y2<1$) is formed by metal organic chemical vapor deposition (step S206).

Then, on the second barrier layer 142, a p-type semiconductor layer including a second layer 151 including p-type AlGaN is formed by metal organic chemical vapor deposition (step S207).

Specifically, the first barrier layer 141 is directly formed on the aforementioned n-type semiconductor layer. The well layer 143 is directly formed on the first barrier layer 141. The second barrier layer 142 is directly formed on the well layer 143. The p-type semiconductor layer is directly formed on the second barrier layer 142. Here, as described above, the n-type semiconductor layer including the first layer 131 can include at least one of the first stacked structural body 210 and the second stacked structural body 220 formed on the first layer 131.

Such a manufacturing method can form semiconductor layers with high crystal quality. By forming a light emitting portion 140 having the SQW structure by this method, a semiconductor light emitting device that emits near ultraviolet light with particularly high efficiency can be manufactured with high productivity.

Here, the process of forming at least one of the first stacked structural body 210 and the second stacked structural body 220 may be further performed. This can increase the light emission efficiency more effectively.

The above method for manufacturing a semiconductor light emitting device is also applicable to a method for manufacturing a wafer.

That is, the method for manufacturing a wafer according to the embodiment of the invention can include the above steps S201 to S207. Thus, a wafer that emits near ultraviolet light with particularly high efficiency can be manufactured with high productivity. Also in this method for manufacturing a wafer, the process of forming at least one of the first stacked structural body 210 and the second stacked structural body 220 may be further performed. This can increase the light emission efficiency more effectively.

The "nitride semiconductor" referred to herein includes semiconductors having any composition represented by the chemical formula $B_x In_y Al_z Ga_{1-x-y-z} N$ ($0 \leq x \leq 1$, $0 \leq y \leq 1$, $0 \leq z \leq 1$, $x+y+z \leq 1$) where the composition ratios x, y, and z are varied in the respective ranges. Furthermore, in the above chemical formula, the "nitride semiconductor" also includes those further containing any group V element other than N (nitrogen), those further containing various elements added for controlling various material properties such as conductivity type, and those further containing various unintended elements.

Hereinabove, exemplary embodiments of the invention are described with reference to specific examples. However, the invention is not limited to these specific examples. For example, various modifications made by one skilled in the art in regard to the configurations, sizes, material qualities, arrangements, etc., of components of semiconductor light emitting devices such as semiconductor layers, light emitting portions, well layers, barrier layers, stacked structural bodies, electrodes, substrates, and buffer layers are included in the scope of the invention to the extent that the purport of the invention is included.

Further, any two or more components of the specific examples may be combined within the extent of technical feasibility; and are included in the scope of the invention to the extent that the purport of the invention is included.

Moreover, all semiconductor light emitting devices, wafers, methods for manufacturing a semiconductor light emitting device, and methods for manufacturing a wafer practicable by an appropriate design modification by one skilled in the art based on the semiconductor light emitting devices, the wafers, the methods for manufacturing a semiconductor light emitting device, and the methods for manufacturing a wafer described above as exemplary embodiments of the invention also are within the scope of the invention to the extent that the purport of the invention is included.

Furthermore, various modifications and alterations within the spirit of the invention will be readily apparent to those skilled in the art. All such modifications and alterations should therefore be seen as within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

The invention claimed is:

1. A semiconductor light emitting device comprising:
   a first layer including at least one of n-type GaN and n-type AlGaN;
   a second layer including p-type AlGaN;
   a light emitting portion provided between the first layer and the second layer, the light emitting portion having a single quantum well structure; and
   a first stacked structural body provided between the first layer and the light emitting portion;
   the single quantum well structure including,
     a first barrier layer including $Al_{x1} Ga_{1-x1-y1} In_{y1} N$ ($0 < x1$, $0 \leq y1$, $x1+y1 < 1$),
     a second barrier layer provided between the first barrier layer and the second layer and including $Al_{x2} Ga_{1-x2-y2} In_{y2} N$ ($0 < x2$, $0 \leq y2$, $x2+y2 < 1$), and
     a well layer provided between the first barrier layer and the second barrier layer; including $Al_{x0} Ga_{1-x0-y0} In_{y0} N$ ($0 \leq x0$, $0 < y0$, $x0+y0 < 1$, $y1 < y0$, $y2 < y0$);
   the first stacked structural body including,
     a plurality of third layers including AlGaInN, each of the plurality of third layers having a thickness smaller than a thickness of the first barrier layer and smaller than a thickness of the second barrier layer, and
     a plurality of fourth layers alternately stacked with the plurality of third layers and including GaInN, each of the plurality of fourth layers having a thickness smaller than a thickness of the well layer.

2. The device according to claim 1, wherein the well layer has a thickness of not smaller than 4.5 nanometers and not larger than 9 nanometers.

3. The device according to claim 1, wherein the well layer has a thickness of not smaller than 5 nanometers and not larger than 7 nanometers.

4. The device according to claim 1, wherein sum of total thickness of the plurality of fourth layers and the thickness of the well layer is not smaller than 25 nanometers and not larger than 45 nanometers.

5. A semiconductor light emitting device comprising:
   a first layer including at least one of n-type GaN and n-type AlGaN;
   a second layer including p-type AlGaN;
   a light emitting portion provided between the first layer and the second layer, the light emitting portion having a single quantum well structure; and
   a second stacked structural body provided between the first layer and the light emitting portion;
   the single quantum well structure including,
     a first barrier layer including $Al_{x1} Ga_{1-x1-y1} In_{y1} N$ ($0 < x1$, $0 \leq y1$, $x1+y1 < 1$),
     a second barrier layer provided between the first barrier layer and the second layer and including $Al_{x2} Ga_{1-x2-y2} In_{y2} N$ ($0 < x2$, $0 \leq y2$, $x2+y2 < 1$), and
     a well layer provided between the first barrier layer and the second barrier layer, including $Al_{x0} Ga_{1-x0-y0} In_{y0} N$ ($0 \leq x0$, $0 < y0$, $x0+y0 < 1$, $y1 < y0$, $y2 < y0$);

the second stacked structural body including,
  a plurality of fifth layers including GaN, each of the plurality of fifth layers having a thickness smaller than a thickness of the first barrier layer and smaller than a thickness of the second barrier layer, and
  a plurality of sixth layers alternately stacked with the plurality of fifth layers and including GaInN, each of the plurality of sixth layers having a thickness smaller than a thickness of the well layer.

6. The device according to claim 1, further comprising:
a second stacked structural body provided between the first layer and the first stacked structural body,
the second stacked structural body including:
  a plurality of fifth layers including GaN, each of the plurality of fifth layers having a thickness smaller than the thickness of the first barrier layer and smaller than the thickness of the second barrier layer; and
  a plurality of sixth layers alternately stacked with the plurality of fifth layers and including GaInN, each of the plurality of sixth layers having a thickness smaller than the thickness of the well layer.

7. The device according to claim 6, wherein
the first barrier layer has a Si concentration higher than a Si concentration in the first stacked structural body,
the second stacked structural body has a Si concentration lower than the Si concentration in the first stacked structural body, and
the second layer has a Si concentration lower than the Si concentration in the second stacked structural body.

8. The device according to claim 1, further including:
a substrate, a major surface of the substrate being a c-plane of a sapphire layer;
a single crystal buffer layer provided between the substrate and the first layer, the single crystal buffer layer including $Al_{x3}Ga_{1-x3}N$ ($0.8 \leq x3 \leq 1$); and
a GaN layer provided between the single crystal buffer layer and the first layer.

9. The device according to claim 1, wherein
the first layer is provided between the first stacked structural body and a GaN layer formed on a substrate made of sapphire, and
the substrate is removed.

10. A wafer comprising:
a first layer including at least one of n-type GaN and n-type AlGaN;
a second layer including p-type AlGaN;
a light emitting portion provided between the first layer and the second layer, the light emitting portion having a single quantum well structure; and
a first stacked structural body provided between the first layer and the light emitting portion;
the single quantum well structure including,
  a first barrier layer including $Al_{x1}Ga_{1-x1-y1}In_{y1}N$ ($0<x1$, $0 \leq y1$, $x1+y1<1$),
  a second barrier layer provided between the first barrier layer and the second layer and including $Al_{x2}Ga_{1-x2-y2}In_{y2}N$ ($0<x2$, $0<y2$, $x2+y2<1$), and
  a well layer provided between the first barrier layer and the second barrier layer, including $Al_{x0}Ga_{1-x0-y0}In_{y0}N$ ($0 \leq x0$, $0<y0$, $x0+y0<1$, $y1<y0$, $y2<y0$);
the first stacked structural body including,
  a plurality of third layers including AlGaInN, each of the plurality of third layers having a thickness smaller than a thickness of the first barrier layer and smaller than a thickness of the second barrier layer, and
  a plurality of fourth layers alternately stacked with the plurality of third layers and including GaInN, each of the plurality of fourth layers having a thickness smaller than a thickness of the well layer.

11. The wafer according to claim 10, wherein the well layer has a thickness of not smaller than 4.5 nanometers and not larger than 9 nanometers.

12. The wafer according to claim 10, wherein the well layer has a thickness of not smaller than 5 nanometers and not larger than 7 nanometers.

13. The wafer according to claim 10, wherein sum of total thickness of the plurality of fourth layers and the thickness of the well layer is not smaller than 25 nanometers and not larger than 45 nanometers.

14. A wafer comprising:
a first layer including at least one of n-type GaN and n-type AlGaN;
a second layer including p-type AlGaN;
a light emitting portion provided between the first layer and the second layer, the light emitting portion having a single quantum well structure; and
a second stacked structural body provided between the first layer and the light emitting portion;
the single quantum well structure including,
  a first barrier layer including $Al_{x1}Ga_{1-x1-y1}In_{y1}N$ ($0<x1$, $0 \leq y1$, $x1+y1<1$);
  a second barrier layer provided between the first barrier layer and the second layer and including $Al_{x2}Ga_{1-x2-y2}In_{y2}N$ ($0<x2$, $0 \leq y2$, $x2+y2<1$), and
  a well layer provided between the first barrier layer and the second barrier layer, including $Al_{z0}Ga_{1-x0-y0}In_{y0}N$ ($0 \leq x0$, $0<y0$, $x0+y0<1$, $y1<y0$, $y2<y0$);
the second stacked structural body including,
  a plurality of fifth layers including GaN, each of the plurality of fifth layers having a thickness smaller than thickness of the first barrier layer and smaller than a thickness of the second barrier layer, and
  a plurality of sixth layers alternately stacked with the plurality of fifth layers and including GaInN, each of the plurality of sixth layers having a thickness smaller than a thickness of the well layer.

15. The wafer according to claim 10, further comprising:
a second stacked structural body provided between the first layer and the first stacked structural body,
the second stacked structural body including:
  a plurality of fifth layers including GaN, each of the plurality of fifth layers having a thickness smaller than the thickness of the first barrier layer and smaller than the thickness of the second barrier layer; and
  a plurality of sixth layers alternately stacked with the plurality of fifth layers and including GaInN, each of the plurality of sixth layers having a thickness smaller than the thickness of the well layer.

16. The device according to claim 1, wherein the light emitting portion is configured to emit near ultraviolet light.

17. The device according to claim 5, wherein the light emitting portion is configured to emit near ultraviolet light.

18. The wafer according to claim 10, wherein the light emitting portion is configured to emit near ultraviolet light.

19. The wafer according to claim 14, wherein the light emitting portion is configured to emit near ultraviolet light.

20. The device according to claim 1, further comprising
a p-side electrode being reflective, the second layer being provided between the p-side electrode and the first layer.

21. The device according to claim 1, wherein
the first layer is provided between the light emitting portion and a GaN layer formed on a substrate, and
the substrate is removed.

22. The device according to claim 21, wherein the substrate is made of sapphire.

23. The device according to claim 1, wherein
a band gap of the well layer is smaller than a band gap of the first barrier layer, smaller than a bandgap of the second barrier layer, smaller than a bandgap of the first layer, and smaller than a bandgap of the second layer.

24. The device according to claim 1, wherein
a band gap of the well layer is smallest among band gaps of semiconductor layers included in the device.

25. The device according to claim 5, further comprising
a p-side electrode being reflective, the second layer being provided between the p-side electrode and the first layer.

26. The device according to claim 5, wherein
the first layer is provided between the light emitting portion and a GaN layer formed on a substrate, and
the substrate is removed.

27. The device according to claim 26, wherein the substrate is made of sapphire.

28. The device according to claim 5, wherein
a band gap of the well layer is smaller than a band gap of the first barrier layer, smaller than a bandgap of the second barrier layer, smaller than a bandgap of the first layer, and smaller than a bandgap of the second layer.

29. The device according to claim 5, wherein
a band gap of the well layer is smallest among band gaps of semiconductor layers included in the device.

* * * * *